US012067186B2

(12) United States Patent
Emigh et al.

(10) Patent No.: US 12,067,186 B2
(45) Date of Patent: *Aug. 20, 2024

(54) TOUCH-BASED CONTROL DEVICE FOR SCENE INVOCATION

(71) Applicant: Brilliant Home Technology, Inc., San Mateo, CA (US)

(72) Inventors: Aaron T. Emigh, San Mateo, CA (US); Bozhi See, San Mateo, CA (US)

(73) Assignee: Brilliant Home Technology, Inc., San Mateo, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/236,348

(22) Filed: Aug. 21, 2023

(65) Prior Publication Data

US 2024/0045537 A1 Feb. 8, 2024

Related U.S. Application Data

(63) Continuation of application No. 17/141,987, filed on Jan. 5, 2021, now Pat. No. 11,755,136.

(Continued)

(51) Int. Cl.
*G06F 3/041* (2006.01)
*G05B 15/02* (2006.01)
(Continued)

(52) U.S. Cl.
CPC .......... *G06F 3/0416* (2013.01); *G05B 15/02* (2013.01); *G06F 3/0443* (2019.05); *H03K 17/9618* (2013.01); *F21V 23/0485* (2013.01)

(58) Field of Classification Search
CPC .... G06F 3/0416; G06F 3/0443; G06F 3/0488; G06F 3/017; G06F 3/0219;
(Continued)

(56) References Cited

U.S. PATENT DOCUMENTS 9,208,676 B2 12/2015 Fadell et al.
9,614,690 B2 4/2017 Ehsani et al.
(Continued)

FOREIGN PATENT DOCUMENTS

CN 107229230 A 10/2017
EP 3073338 A1 9/2016
(Continued)

OTHER PUBLICATIONS

International Search Report and The Written Opinion of The International Searching Authority mailed Apr. 18, 2019, for related PCT Application No. PCT/US19/012698 filed Jan. 8, 2019, 7 pages.

(Continued)

*Primary Examiner* — Ryan A Lubit
(74) *Attorney, Agent, or Firm* — Mahamedi IP Law LLP

(57) ABSTRACT

A control device having an exterior panel and a control module, where the control module includes a sensor layer, and the exterior panel overlays the sensor layer. The control module is configured to determine one or more characteristics of a touch input, and to select a scene based at least in part on the one or more determined characteristics of the touch input. The control module further controls an operational aspect of each device of the set in accordance with the selected scene.

20 Claims, 12 Drawing Sheets

Related U.S. Application Data

(60) Provisional application No. 62/957,294, filed on Jan. 5, 2020, provisional application No. 62/957,302, filed on Jan. 5, 2020, provisional application No. 62/957,297, filed on Jan. 5, 2020.

(51) Int. Cl.
*G06F 3/044* (2006.01)
*H03K 17/96* (2006.01)
*F21V 23/04* (2006.01)

(58) Field of Classification Search
CPC .............. G06F 3/04883; G06F 3/0414; H03K 17/9618; H03K 17/9622; H03K 17/96; H03K 2217/94089; H03K 2217/94094; H04L 12/282; H04L 12/2827; H04L 12/2829; G05B 15/02; G05B 2219/2642; G08C 17/00; G08C 17/02
See application file for complete search history.

(56) References Cited

U.S. PATENT DOCUMENTS

| | | |
|---|---|---|
| 9,835,434 B1 | 10/2017 | Sloo |
| 10,375,897 B2 | 8/2019 | Reilly |
| 11,507,217 B2 | 11/2022 | Emigh |
| 2002/0016639 A1 | 2/2002 | Smith |
| 2003/0040812 A1 | 2/2003 | Gonzales |
| 2006/0132303 A1 | 6/2006 | Stilp |
| 2006/0212136 A1 | 9/2006 | Lee |
| 2008/0158172 A1 | 7/2008 | Hotelling |
| 2008/0223706 A1 | 9/2008 | Hagiwara |
| 2009/0158188 A1 | 6/2009 | Bray |
| 2010/0001746 A1 | 1/2010 | Duchene |
| 2010/0146423 A1 | 6/2010 | Duchene |
| 2011/0063224 A1 | 3/2011 | Vexo |
| 2011/0137836 A1 | 6/2011 | Kuriyama |
| 2012/0259992 A1 | 10/2012 | Koehler |
| 2012/0310415 A1 | 12/2012 | Raestik |
| 2013/0131839 A1 | 5/2013 | Washington |
| 2013/0157729 A1 | 6/2013 | Tabe |
| 2013/0187887 A1 | 7/2013 | Mizuhashi |
| 2013/0201151 A1 | 8/2013 | Takashima |
| 2014/0006465 A1 | 1/2014 | Davis |
| 2014/0071588 A1 | 3/2014 | Chen |
| 2014/0108019 A1 | 4/2014 | Ehsani |
| 2014/0201666 A1 | 7/2014 | Bedikian |
| 2014/0225855 A1 | 8/2014 | Aitchison |
| 2014/0253483 A1 | 9/2014 | Kupersztoch |
| 2014/0257532 A1 | 9/2014 | Kim |
| 2014/0292396 A1 | 10/2014 | Bruwer |
| 2015/0005952 A1 | 1/2015 | Sasaki |
| 2015/0077343 A1 | 3/2015 | Shao |
| 2015/0097780 A1 | 4/2015 | Hotelling |
| 2015/0156031 A1 | 6/2015 | Fadell |
| 2015/0163412 A1 | 6/2015 | Holley |
| 2015/0187209 A1 | 7/2015 | Brandt |
| 2015/0241860 A1 | 8/2015 | Raid |
| 2016/0012348 A1 | 1/2016 | Johnson et al. |
| 2016/0025367 A1 | 1/2016 | Matsuoka et al. |
| 2016/0043926 A1 | 2/2016 | Frei |
| 2016/0117019 A1 | 4/2016 | Takeda |
| 2016/0259308 A1 | 9/2016 | Fadell |
| 2016/0277203 A1 | 9/2016 | Jin |
| 2016/0277204 A1 | 9/2016 | Kang |
| 2016/0372138 A1 | 12/2016 | Shinkai |
| 2017/0005818 A1 | 1/2017 | Gould |
| 2017/0006504 A1 | 1/2017 | Townend |
| 2017/0017324 A1* | 1/2017 | O'Keeffe .............. G06F 3/0412 |
| 2017/0019265 A1 | 1/2017 | Hou |
| 2017/0026194 A1 | 1/2017 | Vijayrao et al. |
| 2017/0131891 A1 | 5/2017 | Novet |
| 2017/0195130 A1 | 7/2017 | Landow et al. |
| 2017/0205958 A1 | 7/2017 | Kurasawa |
| 2017/0220197 A1 | 8/2017 | Matsumoto |
| 2017/0292712 A1 | 10/2017 | Alexander |
| 2017/0336902 A1 | 11/2017 | Smith |
| 2017/0339004 A1 | 11/2017 | Hall |
| 2017/0357439 A1 | 12/2017 | Lemay |
| 2017/0359190 A1 | 12/2017 | Nadathur |
| 2018/0052451 A1 | 2/2018 | Billi-Duran |
| 2018/0091326 A1 | 3/2018 | McLaughlin |
| 2018/0181248 A1 | 6/2018 | Chang |
| 2018/0191517 A1* | 7/2018 | Emigh ................ G06F 3/04847 |
| 2018/0292962 A1 | 10/2018 | Choi |
| 2018/0300645 A1 | 10/2018 | Segal |
| 2018/0323996 A1 | 11/2018 | Roman |
| 2019/0029096 A1* | 1/2019 | O'Driscoll ............. H05B 47/19 |
| 2019/0035567 A1 | 1/2019 | O'Keeffe |
| 2019/0215184 A1 | 7/2019 | Emigh et al. |
| 2019/0229943 A1 | 7/2019 | Edwards |
| 2019/0265858 A1 | 8/2019 | Nishio |
| 2019/0280891 A1 | 9/2019 | Pognant |
| 2019/0371145 A1 | 12/2019 | McQueen et al. |
| 2020/0007356 A1 | 1/2020 | Mason |
| 2020/0028734 A1 | 1/2020 | Emigh et al. |
| 2020/0097112 A1 | 3/2020 | Seo |
| 2020/0210022 A1 | 7/2020 | Kim |
| 2021/0019284 A1 | 1/2021 | Bowman |
| 2021/0194758 A1 | 6/2021 | Emigh |
| 2021/0208723 A1 | 7/2021 | Emigh |
| 2021/0208724 A1 | 7/2021 | Emigh |
| 2021/0210939 A1 | 7/2021 | Emigh |
| 2021/0211319 A1 | 7/2021 | See |
| 2021/0218399 A1 | 7/2021 | Cardanha |
| 2022/0006664 A1 | 1/2022 | Emigh |
| 2022/0224596 A1 | 7/2022 | Emigh |
| 2023/0019612 A1 | 1/2023 | See |
| 2023/0044270 A1 | 2/2023 | Emigh |

FOREIGN PATENT DOCUMENTS

| | | |
|---|---|---|
| EP | 3131235 A1 | 2/2017 |
| EP | 2887166 B1 | 7/2019 |
| WO | WO-2017/107521 | 6/2017 |
| WO | WO-2017/192752 | 11/2017 |
| WO | WO-2018/129105 | 7/2018 |
| WO | WO-2019/136440 | 7/2019 |
| WO | WO-2020/018995 | 1/2020 |

OTHER PUBLICATIONS

International Search Report and The Written Opinion of The International Searching Authority mailed Nov. 14, 2019, for related PCT Application No. PCT/US19/42843 filed Jul. 22, 2019, 8 pages.
International Search Report and The Written Opinion of The International Searching Authority mailed Feb. 25, 2021, for related PCT Application No. PCT/US21/12214 filed Jan. 5, 2021, 8 pages.
Extended European Search Report dated Mar. 9, 2022, Application No. 19837970.3, 11 pages.
Extended European Search Report dated Dec. 12, 2023, Application No. 21736185.6-1211 8 pages.

* cited by examiner

TOUCH-BASED CONTROL DEVICE FOR SCENE INVOCATION

RELATED APPLICATIONS

The application is a continuation of U.S. patent application Ser. No. 17/141,987 filed Jan. 5, 2021, which claims the benefit of (i) U.S. Provisional Patent Application No. 62/957,294, filed Jan. 5, 2020; (ii) Provisional U.S. Patent Application No. 62/957,297, filed Jan. 5, 2020; and (iii) Provisional U.S. Patent Application No. 62/957,302, filed Jan. 5, 2020; the contents of each of the aforementioned priority applications being hereby incorporated by reference in their respective entireties for all purposes.

TECHNICAL FIELD

This applications relates to control devices, and more specifically, touch-based control devices to invoke scenes.

BACKGROUND

Home control systems, such as lighting control systems used for lighting fixtures, include binary analog switches and analog dimmer switches that enable users to control one or more lights wired to an electrical box upon which such switches are connected. Furthermore, when a person wishes to activate or interact with home systems, the person typically must interact with an actual device of the system or a dedicated or universal remote control and manually create an environment comprising activated or dimmed lights, audio system output, visual system output (e.g., a television or digital picture frame output), temperature, and the like.

BRIEF DESCRIPTION OF THE DRAWINGS

The disclosure herein is illustrated by way of example, and not by way of limitation, in the figures of the accompanying drawings in which like reference numerals refer to similar elements, and in which.

DETAILED DESCRIPTION

Figure 1A:
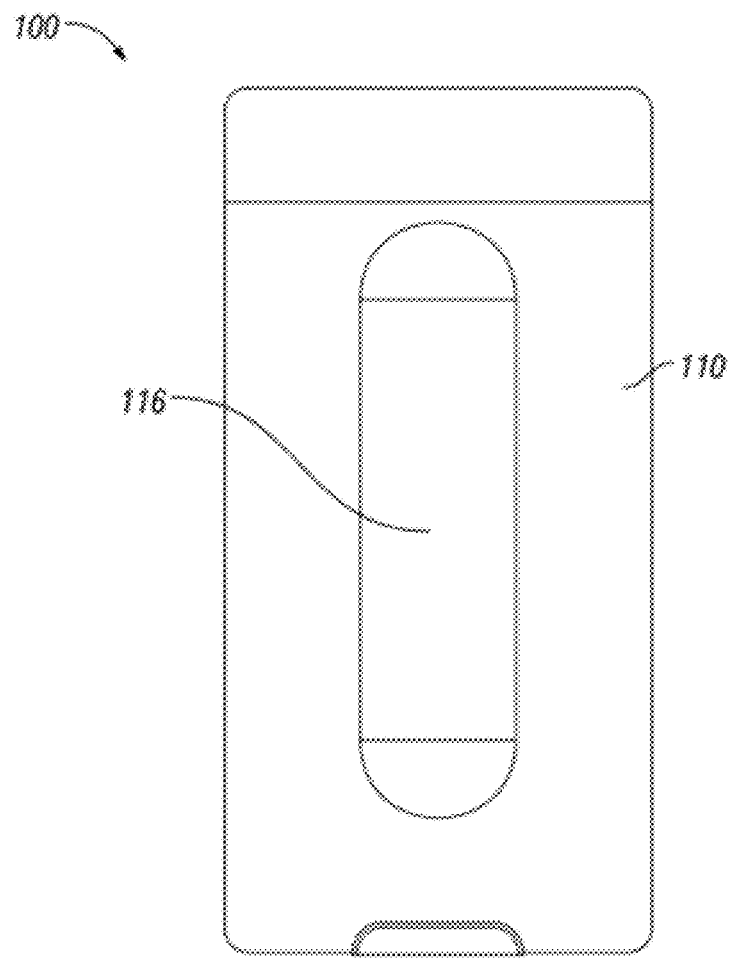
FIG. 1A and FIG. 1B illustrate a touch-based control device, according to one or more examples.

In various embodiments, a touch-based control device includes an exterior panel and a control module. In examples, the control module detects and interprets touch input provided by a user on the exterior panel. Based on the interpreted input, the control device implements a control operation to affect an operation of one or more controlled devices.

Examples include a control device having an exterior panel and a control module, where the control module includes a sensor layer, and the exterior panel overlays the sensor layer. The control module is configured to determine one or more characteristics of a touch input, and to select a scene based at least in part on the one or more determined characteristics of the touch input. The control module further controls an operational aspect of each device of the set in accordance with the selected scene.

Still further, some examples provide for a base assembly that can combine with an exterior panel to form a wall-mountable control device. In such examples, the base assembly includes a control module that includes a sensor layer, and the control module is structured to position the sensor layer near a surface where the exterior panel is to be provide.

According to examples, a control device includes a control module and an exterior panel. The exterior panel overlays a sensor layer of the control module to detect and interpret touch input. The control module is further operable to control a set of devices. In examples, the control module is configured to determine one or more characteristics of a touch input that is detected on the exterior panel. The control module selects a scene based at least in part on the one or more determined characteristics of the touch input. The control device can further implement an operational aspect of each device of the set in accordance with the selected scene.

According to some examples, a scene can (i) identify one or more controlled devices of the control device 100, and (ii) one or more settings or other operational aspects of each identified controlled device. As an addition or variation, a scene can identify a set of operations which the control device can perform, to cause one or multiple controlled devices to implement a setting or other operational aspect, in accordance with the scene. Further, in examples, a scene can be defined by a data structure which identifies each of (i) one or more devices, and (ii) a setting or other operational aspect of each of the one or more devices. As an addition or variation, a scene can be defined by a data structure that identifies one or more operations which the control device can perform to cause a set of controlled devices to operate at a particular setting or other operational aspect. As described with various examples, each operation performed by a control device to implement a scene can include correspond to (i) a switching operation or configuration to control a power supply of a load device, or (ii) a command, transmitted by the control device through a wireless or wireline communication medium, to cause a controlled device to implement a setting or other operational aspect.

In various examples, the control device operates to (i) interpret any one of multiple possible gestures or touch inputs of a user, and (ii) implement a set of operations that are pre-associated with the interpreted gesture or touch input. In examples, the multiple possible gestures or touch inputs can be defined by one or more characteristics of the touch input, such as a direction, length, linear path, duration, or other characteristic of the touch input. Examples of gestures and touch inputs include tap actions (e.g., single, double, triple, or more digit tap inputs), one or more long touches, slide inputs (e.g., continuous touching motion in a leftward, rightward, upward, or downward direction) and curved or shaped inputs. Still further, gestures can include more complex motions, such as multi-directional inputs or patterned inputs (e.g., long touch followed by short tap).

In some examples, the gesture control device comprises a home device controller, such as an intelligent light switch device that includes functionality for switching and dimming lights of a dwelling. In such examples, the gesture control device selects and implements a scene that corresponds to a detected input action performed by the user. As a home device controller, the gesture control device can be wirelessly connected to one or more smart home devices or systems (e.g., a smart light, temperature control system, audio or entertainment system, etc.). In certain implementations, the home device controller can be wired to a home device (e.g., a light) using existing home wiring (e.g., light switch wiring) of a household. A user can interact with the home device controller via touch gesture inputs to remotely operate a local network of smart home devices connected to the gesture control device.

In examples, the user can implement a scene for a portion of a dwelling (e.g., bedroom, kitchen, floor or house hold, etc.), where the scene identifies preset settings for one or multiple devices in the portion of the dwelling. In further examples, multiple control devices can be used to implement multiple different scenes in different portions (e.g., rooms) of the dwelling. For example, the user can enter a double tap on the external panel of the control device in a first room to implement a first scene for that room, and a double (or other gesture) input to implement another scene in another room.

In at least some examples, a control device includes at least one groove formed on the exterior panel to receive at least a first type of input. Additionally, the touch-sensitive panel includes one or more surrounding regions that are capable of receiving at least a second type of input.

Accordingly, in response to receiving touch input, the control device performs an output function, such as to control one or more controlled devices, via a switch interface, wireless interface or wireline connection, based on the interpreted touch input.

Among other benefits, the examples described herein achieve a technical effect of automatically creating a scene in a smart home environment through network communications between a gesture control device and a set of smart home devices. Techniques described herein comprise the use of one or more control devices operating a network of devices (e.g., load and smart home devices) to implement scenes as responses to touch inputs of the user, such that there is no need for direct operation of the controlled devices by the user.

Touch-Based Control Device to Detect Gestures

Figure 1B:
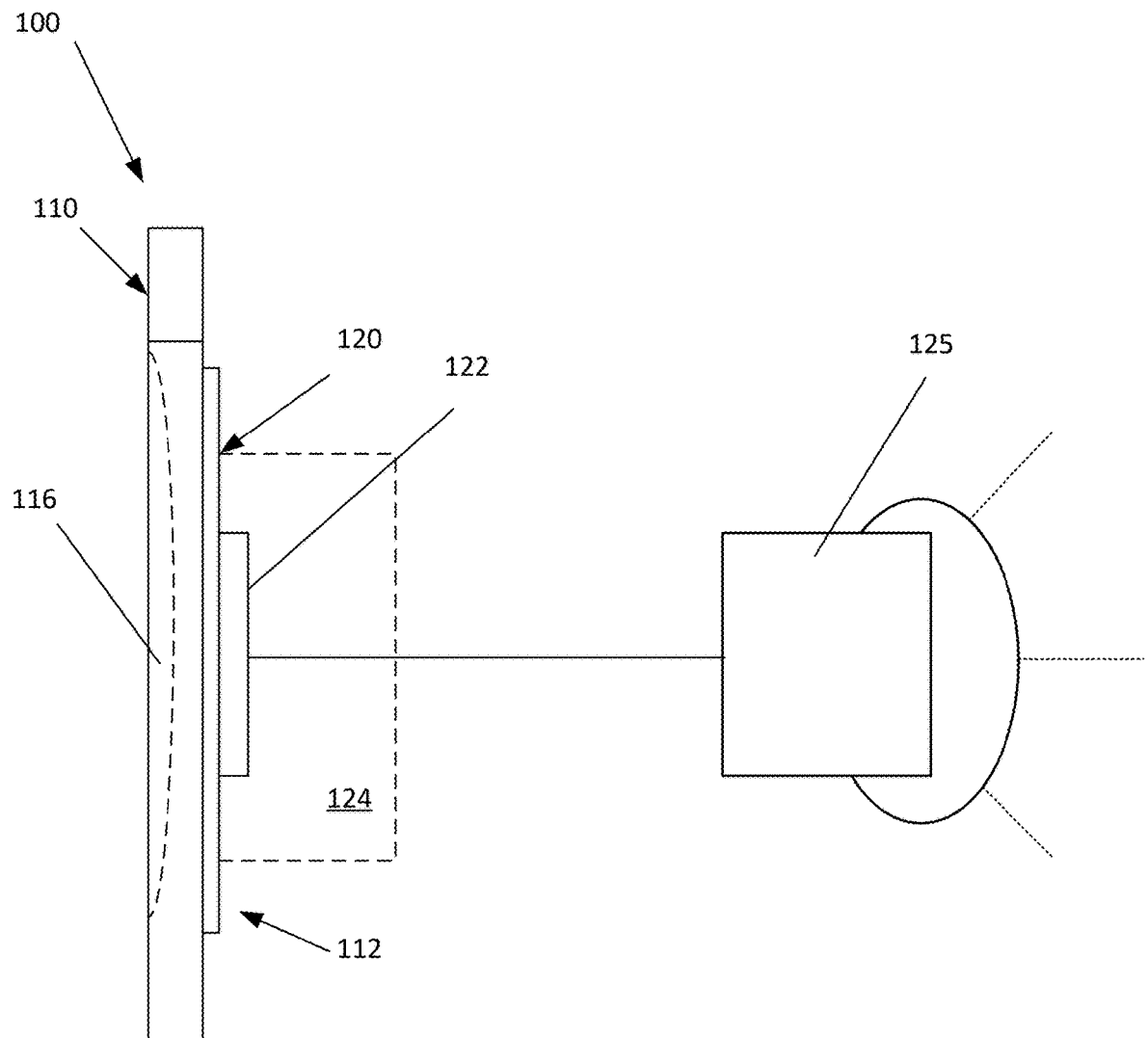

FIG. 1A and FIG. 1B illustrate a touch-based control device, according to one or more examples. An example touch-based control device 100 includes an exterior panel 110 that overlays a control module 120. As described with some examples, the control device 100 can be wall-mounted or otherwise provided in a dwelling or room to control operational aspects of a set of controlled devices 125, based on touch input of the user. In examples, the control device 100 detects multiple types of inputs, including gesture input, at multiple regions of the exterior panel 110. In turn, the control device 100 can control operational aspects of the controlled devices 125 based on the type of input and/or the location of the input. Additionally, the control device 100 can automatically implement one or multiple scenes based on the type of touch input and/or the location of the touch input. For example, individual scenes can be associated with particular gestures (or touch input types) and/or regions where the touch input is received. When the control device 100 detects a particular input type and/or location which is associated with a specific scene, the control device 100 performs operations that cause each device associated with the specific scene to operate in accordance with a predefined operational aspect.

In examples, the exterior panel 110 overlays touch sensors (e.g., a layer of capacitive sensors), such that touch input can be detected and interpreted at various locations over a substantial portion of the exterior panel 110. Sill further, the control device 100 can be structured to detect touch input which is received at any location of the exterior panel 110.

In some examples as shown, the exterior panel 110 includes a touch groove 116 which designates a region where a user can provide a particular type of touch input. In variations, the exterior panel 110 includes multiple input grooves that designate areas where touch input can be received. In other variations, other forms of three-dimensional touch input features can be used in place of or in addition to the touch groove 116. In such examples, the control device 100 can receive additional types of touch input on regions of the exterior panel 110 which surround the touch groove 116 and/or other three-dimensional features.

According to examples, the control device 100 includes a housing structure 104 having an exterior panel 110 and a base assembly 112 that includes a control module 120. The control device 100 can be wall-mounted, with the base assembly 112 being provided within, for example, a wall receptable or recess, and the exterior panel 110 forming a thickness over the corresponding wall. In such examples, the base assembly 112 can further include an electrical interface 122 to electrically connect the control device 100 to a power supply line of a dwelling. The electrical interface 122 can include wiring and switching elements to enable control module 120 to generate a switching output that controls the configuration of the switching elements of the electrical interface 122.

As described with some examples, the controlled devices 125 can include load devices and connected devices. Load devices refer to devices which have power supply lines (sometimes referred to as "load lines") that are controllable by the control device. Controlled devices refer to devices that have wireless or wireline communication interfaces that can receive commands from the control device 100. Still further, controlled devices can include devices that can be controlled through power supply switching and commands. For example, many conventional-type load devices include wireless receivers (e.g., WiFi-enabled lighting devices), and some types of devices can receive communications through a powerline communication medium. In examples, the control device 100 can implement a predetermined setting (or settings) that corresponds to an operational aspect of a controlled device using switching configurations on power supply lines of load devices and/or commands signaled through wireless or wireline mediums of connected devices.

The control device 100 can control the operational aspect of a load device by controlling a power supply to the respective device. For example, the controlled device(s) 125 can include a set of load devices (e.g., light switch, ceiling fan, thermostat, etc.) which connect directly to a power line of a dwelling. In such cases, the control device 100 can be wall-mounted to function as a switch (e.g., light switch) that controls the power supply to such devices. Through control of the power supply, the control device 100 can control operational aspects of load devices, such as whether the load devices are on or off and/or the operational level of the load devices (e.g., dim level of lights, fan speed of ceiling fan, etc.). To implement a scene using such types of controlled devices 125, the control device 100 can implement one or more switching type operations to control operational aspects such as on/off and power levels (e.g., dimmed lights, ceiling fan speed, etc.) of the controlled devices 125. The control device 100 can implement the switching operations or configurations via, for example, switching elements of the electrical interface 122.

As an addition or variation, the control device 100 controls the operational aspect of one or more controlled devices 125 by performing operations that include signaling one or more commands to the controlled device(s) 125, where the commands cause the controlled device to implement a particular operational aspect. In some examples, the control device includes a wireless transceiver that can wirelessly signal commands to the controlled device 125, either directly or indirectly through an intermediate device. As an addition or variation, the control device 100 can signal commands to the controlled device using a wireline connection.

In some examples, the control device 100 can have a primary function of operating as a light switch to control a set of load devices, including lights, ceiling fan and power outlets. As described with some examples, the control device 100 can also control one or more connected devices (e.g., appliance, security camera, a security system, a door lock, a television, an audio (or media) system, or other types of devices) via, for example, a wireless interface.

The exterior panel 110 can include multiple input regions where touch input can be detected and interpreted. In some examples, the input regions of the exterior panel 110 include touch groove 116, and one or more regions that surround the touch groove 116. The touch groove 116 can be structured as an elongated (e.g., vertically elongated) indentation within the exterior panel 110, and the surrounding region(s) of the touch panel can be flat or substantially two-dimensional. In such examples, the control device 100 can receive touch input within or on the touch groove 116 (e.g., swipe in direction of groove), as well as on the surrounding regions to the touch groove 116. The control device 100 can further map or otherwise interpret touch input differently, depending on whether the particular region where the input is received. For example, a touch input received within the touch groove 116 can be interpreted as a first command, while a touch input received on the surrounding regions of the exterior panel 110 can be interpreted as a second command.

Still further, in some examples, the control device 100 can detect and interpret touch input received at any location of the exterior panel 110. Thus, for example, a touch input can be received or extended on or near a corner or perimeter region of the exterior panel 110. The control device 100 can respond by implementing an output operation that controls an operational aspect of a device or set of devices. Still further, the control device 100 can implement a scene where operational aspects of one or multiple controlled devices 125 are controlled, in accordance with predetermined settings (e.g., as defined by a scene) for the respective controlled devices.

In variations, the exterior panel 110 may not have touch groove 116, but instead comprise a flat panel formed of the same material as a remainder of the exterior panel. For example, the control device 100 may have a substantially planar surface operatively coupled to an underlying sensor layer of the control module 120, as described with FIG. 2A through FIG. 2C.

Still further, in variations, the exterior panel 110 lacks a display surface. Thus, in such examples, the control device 100 can detect and interpret touch input at any location of a display-less exterior panel 110, and with or without touch grooves or other surface features, as the case may be.

With respect to examples as described, the control device 100 can determine characteristics of a touch input from which the control device 100 can detect and interpret input. Further, the control device 100 can map or otherwise interpret a detected gesture as a specific input. In response, the control device 100 can implement an operation one or more operations (e.g., switching functions, command transmissions) to control operational aspects of one or more controlled devices 125. By way of example, the control device 100 can control operational aspects of a set of controlled devices 125 in a dwelling (e.g., room in house), where the set of controlled devices 125 can include one or more devices selected from, for example, a group that includes a lighting device, a ceiling fan, a thermostat, an appliance, a security camera, a security system, a door lock, a television, an audio (or media) system, or other types of devices.

In certain implementations, the control device 100 can be implemented as a wall-mounted control device that interprets touch inputs from users, and further interprets detected touch inputs to control operational aspects of a set of controlled devices 125. As an addition or variation, the control device 100 detects touch input as gestures, and further control operation aspects of multiple controlled devices 125 at one time based on the detected gestures. Still further, as described with some examples, the control device 100 implements a scene in response to detecting corresponding touch inputs on the exterior panel 110. For control device 100, each scene can represent (i) a selection of one or more devices of a set of controlled devices 125, and (ii) an operational setting of each controlled device 125 of the selection. The control device 100 can associate a gesture with a scene, such that when the control device 100 detects the user providing a touch input that is detected as the gesture, the control device 100 automatically implements the scene. By implementing the scene, the control device 100 performs operations which result in implementation of the operational aspect of each controlled device 125, such that each controlled device operates at a particular setting or set of settings. The control device 100 can implement the operational aspect by, for example, controlling a power supply for the controlled device 125 (e.g., lights) and/or by sending one or more commands to individual devices of the selection, to cause each of the respective devices to operate with the predetermined operational setting.

By way of illustration, the control device 100 interprets (i) a first user gesture (e.g., a lateral swipe gesture) as on/off input, and the control device 100 responds to the input by causing a first controlled device (e.g., light) to switch on or off; and (ii) a second gesture (e.g., a slide or touch and drag gesture on touch groove 116), as a range value setting command (e.g., dimming) for the first controlled device or for one or more second controlled devices. By way of example, gesture input can be used for on/off and/or dimming control on a set of connected lights of a dwelling.

Still further, the touch-based control device 100 can interpret one or more touch inputs as being associated with a user specified setting of one or more controlled devices 125 (e.g., an audio device, an entertainment system, etc.). The control device 100 can implement a setting, or set of settings, based on predetermined values specified by a scene.

With reference to FIG. 1B, the control device 100 includes exterior panel 110 with touch groove 116 (shown in phantom) and control module 120. In certain examples, the control module 120 can include touch-sensitive sensors that enable the control module 120 to detect gesture and other inputs received on the exterior panel 110. The control module 120 can further include control logic, circuitry, sensors and other configurations for detecting touch input at any location on the exterior panel 110, and for interpreting the touch input as a gesture. The control module 120 can be configured to detect and interpret any one of multiple gestures, where each gesture is associated with a command or set of commands. Thus, for example, the control device 100 can be capable of detecting multiple touch inputs or gestures, with each touch input or gesture being associated with a corresponding scene. To implement each scene, the control device 100 transmits control commands to a number of controlled devices 125 in order to implement a scene that is associated with a detected touch input or gesture.

Additionally, in various examples, the control module 120 includes an electrical interface 122 to connect the control module 120 to electrical switching elements that control a power supply to one or more controlled devices 125. When mounted to an underlying wall, the electrical interface 122 can be electrically connected to the electrical and switching elements, which can be housed within an electrical box 124 (e.g., a gang-box of an existing light switch panel). The control module 120 can be mounted against the wall, and the exterior panel 110 can form a façade or faceplate for the control module 120. In certain examples, the touch-based control device 100 can be mounted to replace existing light switch panels of a dwelling, such as analog light switches common in the art.

In implementations, the control module 120 includes a circuit board that includes touch-sensitive sensors that generate reactive signals in response to touch inputs performed on the control device 100. In some aspects, the control module 120 can be configured to sense touch inputs anywhere on the exterior panel 110. The control module 120 includes capacitive sensors that can detect change in an electric field about any point on the exterior panel 110 of the touch-based control device 100. The touch-based control device 100 can further include logic to correlate the detected changes in electric field to touch inputs of the user, and further, in some examples, to characteristics of the user's touch inputs.

In further aspects, the sensors may also determine one or more characteristics of the touch input. The detected characteristics of the touch input can correspond to, for example, (i) a direction of the movement, (ii) a length of movement, (iii) a linear or two-dimensional path (or shape) of the touch input, (iv) a duration of the touch input, (v) a time interval between discrete touches of the touch input, (vi) a velocity or acceleration of movement of the touch input, and/or (vii) other characteristics determined of the touch input. Still further, in some variations, the determined characteristics of the touch input can correspond to a touch force exerted on the surface (e.g., such as may be detected by use of a force sensor), a velocity of the touch input (e.g., speed of a swipe), and/or acceleration of the touch input. The control module 120 can include memory storing sensor logic executable by processing resources to interpret the reactive signals. In certain implementations, execution of the sensor logic can cause the control module 120 to identify locations on the exterior panel 110 where a touch input occurs and interpret the touch input a gesture, or a set of gestures, to control one or more functions of the controlled device 125.

The control device 100 can also include wireless communication resources to enable wireless communications with one or more controlled devices 125. The circuit board of the control module 120 can include one or more wireless transceivers and associated logic (e.g., a wireless chip) to enable the control module 120 to receive instructions and data from a user's mobile device, a base station controller, and/or other controllable devices. In certain examples, a wireless transceiver of the control device 100 can also communicate commands and other information to one or more controlled devices 125 using Bluetooth, Wi-Fi, cellular or other wireless communication channel.

In certain examples, a user can operate a mobile computing device to specify which controlled devices 125 of a dwelling are to be controlled by the control device 100. Still further, in some examples, a user can operate a mobile computing device to define a scene, where the scene defines one or more settings of each controlled device 125.

Embodiments recognize that human touch may be irregular and imprecise, and considerable variation in touch inputs may exist between users. According to various examples, the control module 120 can accurately interpret instances when the user's touch input is a tap input (e.g., single tap, double tap, tap pattern, etc.), slide input (e.g., short side, long slide, 'S' or other similar gesture), or other type of touch input (e.g., tap and hold). Still further, the control module 120 can include logic to detect different touch inputs from different users (e.g., users of a household), when variations amongst different users may exist. For example, the control module 120 can define a touch input as a tap input or a slide input based on one or more characteristics of the touch input, including characteristics corresponding to an amount or distance of movement occurring when the user contacts the exterior panel 110, whether any linear movement in the touch input occurs as opposed to an incidental touch, a contact duration of the touch input, an initial location of the touch input, an ending location of the touch input, whether the touch input occurs within the touch groove 116 or wholly on the exterior panel 110, and the like.

According to certain implementations, the control module 120 can include computing resources such as one or more processors and memory storing executable instructions that implement the interpretive and control functions described herein. In variations, the control module 120 can comprise dedicated circuitry, such as one or more application-specific integrated circuits (ASICs) or a configured field-programmable gate array (FPGA) that perform the interpretation and control functions described herein. In either case, the control module 120 can perform conflict resolution actions that decipher sensory inputs performed on the touch-based control device 100, determine a control action to perform on the controlled device(s) 125, and execute the control action accordingly for each touch input.

In various implementations, the control module 120 can determine which control operation to perform (e.g., on/off, mode selection, device selection, range value (e.g., power level) determination) based on whether the touch input is interpreted as a tap or a slide. For example, if the control module 120 interprets a touch input as a tap the control module 120 can implement a switching operation via the electrical interface 122 to switch the load device(s). The switching operation can have the effect of switching the load device(s) from an on state to an off state, or from the off state to the on state.

In contrast, if the control module 120 interprets the touch input as a slide, the control module 120 can implement a range value type command via the electrical interface 122, where a range value is determined by the input. The range value command or operation sets a numeric value between a minimum and maximum, representing a respective minimum or maximum parameter of an operational aspect of a device. In examples, the range value can represent brightness, volume, power level, fan speed, or other similar operational setting of a controlled device. In an example in which the control device 100 implements a range value type operation, control module 120 can use a detected magnitude, slide distance, and/or slide direction of the slide input to determine a final power state (e.g., dimming) for the controlled device(s) 125. The control module 120 can then implement the dimming operation via the electrical interface 122 accordingly.

In certain implementations, the location of the touch input on the touch-based control device 100 can cause the control module 120 to execute a control operation. For example, if the touch input is performed within the touch groove 116, the control module 120 can automatically interpret the touch input as a range value command or setting for a controlled device 125. In variations, the location of the touch input on the touch-based control device 100 does not matter. Rather, the characteristics of the touch input itself anywhere on the surface of the touch-based control device 100 can be interpreted consistently. In such variations, the control module 120 can perform conflict resolution functions to determine whether any particular touch input performed on the touch-based control device 100 was a tap input or a slide input.

In still further implementations, the control module 120 can interpret touch inputs performed in the surrounding exterior region 110 as on/off commands—whether the touch inputs are, for example, tap, double-tap, tap and hold, double tap and hold, or slide inputs—whereas the control module 120 can interpret between tap and slide inputs when they are performed within the touch groove 116. According to such examples, touch inputs within the touch groove 116 can be distinguished by the control module 120 as either tap inputs or slide inputs, which can cause the control module 120 to execute, for example, an on/off command, a device selection command, a mode selection command, a range value command and/or another type of command.

According to various examples, upon sensing a touch input on the surface of the control device 100 or specifically within the touch groove 116 of the touch-based control device 100, the control module 120 can execute conflict resolution logic to determine whether a particular touch input is a tap gesture or a slide gesture. For example, the conflict resolution logic may be triggered when a confidence level corresponding to the touch input is below a particular threshold (e.g., 95%). Once triggered, the control module 120 can execute the conflict resolution logic by determining whether a linear movement of the touch input exceeded a certain threshold (e.g., one centimeter). If so, then the sensing logic can interpret the touch input as a slide input and execute, for example, a command to adjust a power level of the controlled device 125 (e.g., dimming on a light element). However, if not, then the control module 120 can interpret the touch gesture as a tapping gesture and execute an on/off command, depending on the current state of the controlled device 125.

Additionally, once the control device 100 is installed and configured to control a group of controlled devices 125, the user can further operate an application on a mobile computing device to connect with the control device 100 and configure the control device 100 using, for example, a Bluetooth or WiFi connection formed via a wireless transceiver of the control module 120. Among other configurations, the control device 100 can be configured to associate one or more touch inputs or gestures with one or more corresponding scenes, where each scene specifies a set of settings or other operational aspects of one or more selected devices of the group. For any given control device 100, a user can operate the application on the user's computing device to associate a type of touch input (e.g., continuous gesture) and/or location of the touch input with a scene.

Accordingly, the control device 100 can detect touch inputs on any region of the exterior panel 110. When the touch input is detected as a gesture having association to a pre-associated scene, the control device 100 implements a series of control operations (e.g., switching functions, command transmissions) to implement desired settings on multiple devices. The control module 120 includes sensor logic to interpret the reactive signals from the touch sensors, including logic to identify locations on the exterior panel 110 or touch groove 116 where the touch occurred, and interpret the touch as a gesture input for executing a pre-configured scene.

Additionally, the control module 120 can further include control logic to implement control operations in response to detecting touch inputs, such as tap inputs and slide inputs. For example, the controlled device(s) 125 can be operated by the control device 100 based on tap inputs that switch, for example, the connected light(s), from on to off or vice versa, and slide inputs for dimming the connected light(s). For other controlled devices 125, the control operation can include communicating wirelessly to switch the target device power state and/or implement a setting or other control parameter (e.g., raise the volume of a television or audio device).

According to various examples, upon sensing a touch input on the surface of the control device 100 or specifically within the touch groove 116 of the touch-based control device 100, the control module 120 can execute conflict resolution logic to determine whether a particular touch input is a tap gesture or a slide gesture. For example, the conflict resolution logic may be triggered when a confidence level corresponding to the touch input is below a particular threshold (e.g., 95%). Once triggered, the control module 120 can execute the conflict resolution logic by determining whether a linear movement of the touch input exceeded a certain threshold (e.g., one centimeter). If so, then the sensing logic can interpret the touch input as a slide input and execute, for example, a command to adjust a power level of the controlled device 125 (e.g., dimming on a light element). However, if not, then the control module 120 can interpret the touch gesture as a tapping gesture and execute an on/off command, depending on the current state of the controlled device 125.

While numerous examples are described with reference to control device 100, some embodiments may be directed to the base assembly 112, which can be installed in a dwelling separately from the exterior panel 110. In examples, the base assembly 112 is structured to position the control module 120 within a threshold proximity to an exterior panel that is to be assembled onto the base assembly upon installation of the base assembly within a dwelling. The threshold proximity may be based on the range of sensitivity of the sensor layer, specifically with respect to the sensor layer detecting touch input on the exterior panel 110.

Touch Anywhere Construction

Figures 2A, 2B:
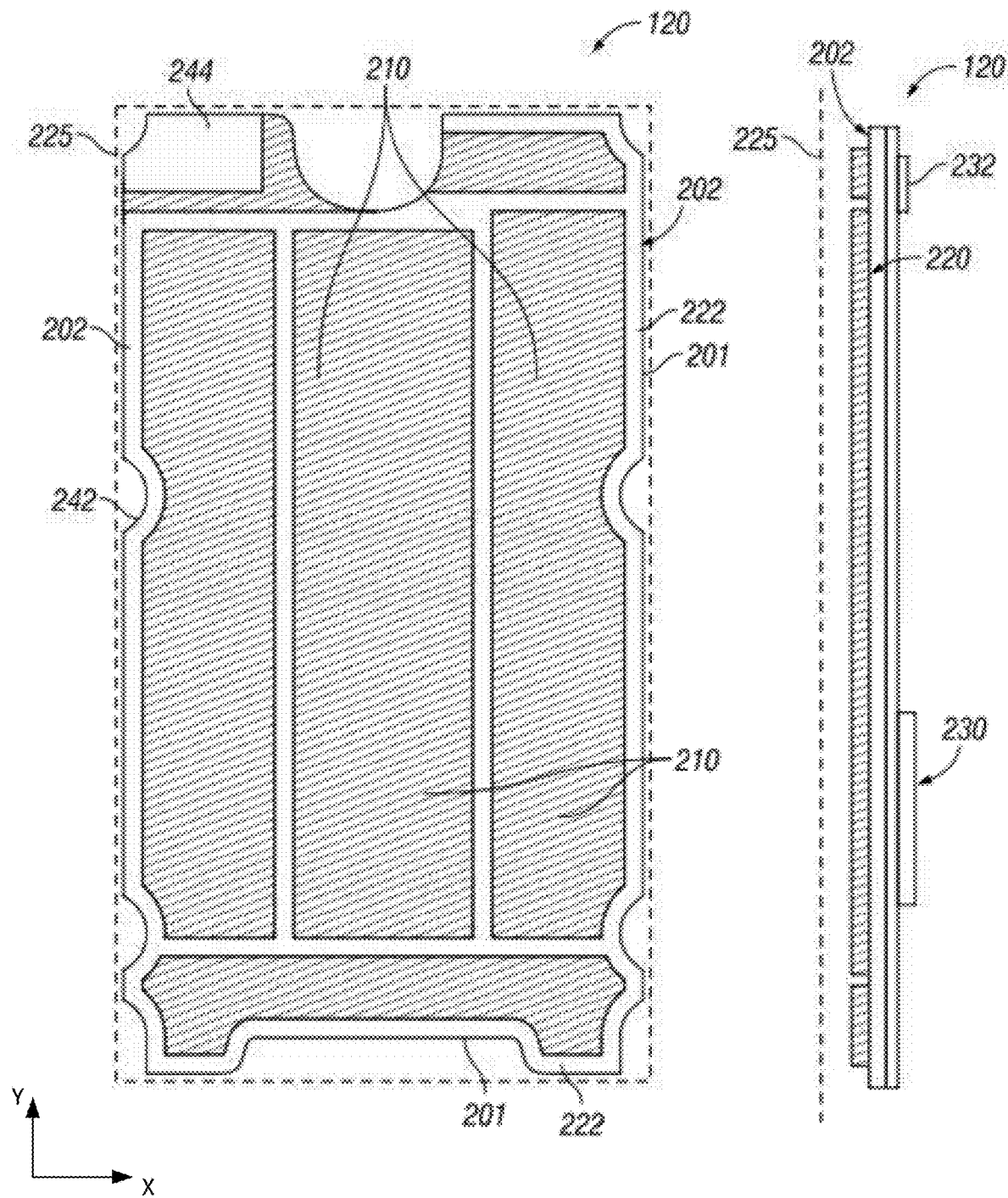
FIG. 2A is a front view of a printed circuit board (PCB) for a control module, according to one or more examples.
FIG. 2B is a side view of the PCB of FIG. 2A, according to one or more examples.
Figure 2C:
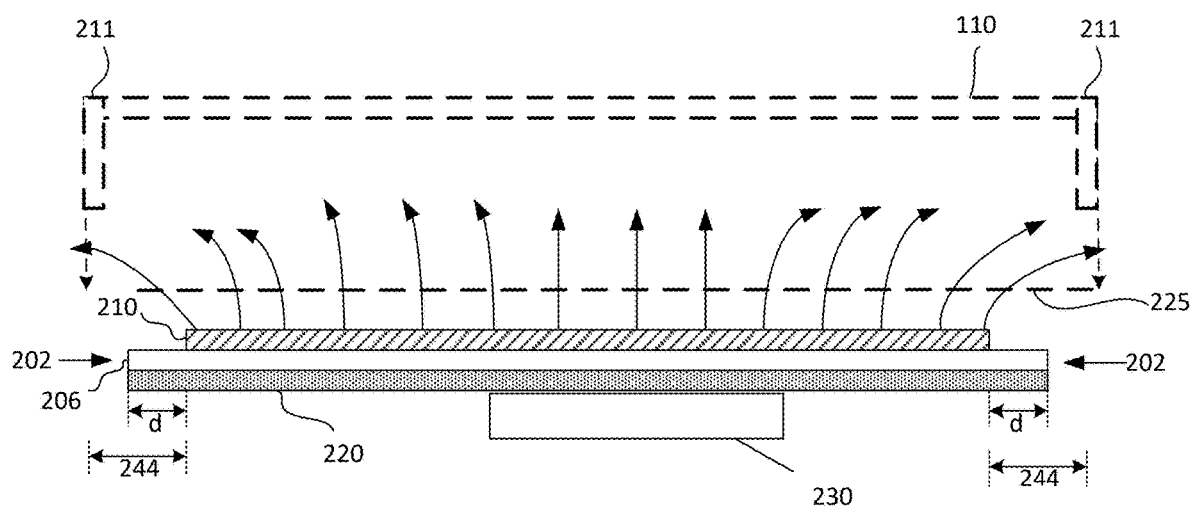
FIG. 2C is a sectional view of a control device of FIG. 2A along lines A-A, according to one or more examples.

FIG. 2A through FIG. 2C illustrate the control module 120 structured to enable control device 100 to sense touch-input on any location of the exterior panel 110, according to one or more examples. FIG. 2A is a front view of a printed circuit board (PCB) 202 for control module 120, according to one or more examples. FIG. 2B is a side view of the PCB 202 of FIG. 2A. FIG. 2C is a sectional view of the control device 100 along lines A-A, according to one or more examples.

With reference to FIG. 2A and FIG. 2B, control module 120 includes a PCB 202 having a sensing layer 210, a reference plane 220 on which the sensing layer 210 is formed, and sensing control logic 230 to detect and interpret sensor values detected by the sensing layer 210. The sensing layer 210 can be formed from conventional PCB fabrication techniques, such as by etching sensors into copper foil. In some examples, the reference plane 220 is a copper grounding plane. The sensing control logic 230 can be implemented through, for example, a microprocessor that is electrically connected to the sensing elements of the sensing layer 210. As shown, the sensing control logic 230 can be implemented by, for example, a microprocessor that is provided on a back side of the PCB 202, along with other components (e.g., wireless transceiver 232), circuit elements, and electrical interface (not show).

When installed, the exterior panel 110 can mount directly over or in close proximity to the sensing layer 210, such that the individual sensing elements of the sensing layer 210 can detect fluctuations in an electric field caused by introduction of a capacitive object, such as a human finger which inherently carries capacitance. With reference to FIG. 2A, a touch region 225 can represent an overlay region of the exterior panel 110, coinciding with the region of the exterior panel 110 where touch-input can be detected and interpreted. As shown by FIG. 2A, the touch region 225 can encompass one or multiple regions that extend over regions where no capacitive sensing elements are provided. For example, the PCB 202 may include one or more structure void regions 242, corresponding to a shape or other structural feature (e.g., through-hole) of the PCB 202 where no sensing elements exist. As an addition or variation, the touch region 225 can extend over the one or more perimeter regions 246, which can extend beyond a perimeter edge of the PCB 202 to encompass, for example, a perimeter edge or thickness of the exterior panel 110. In such examples, the control module 120 can detect and interpret touch-input of the user, even when the touch-input does not directly overlay the sensing elements of the sensing layer 210, such as in the case when the touch-input is at or near an edge region of the exterior panel 110 so as to directly overlay an area that is beyond the perimeter edge 201 of the PCB 202.

Still further, in some implementations, the reference plane 220 can include one or more sensor void regions 244 that are intended to accommodate design aspects of the sensing layer 210. For example, the control module 120 can include a sensor void region 244 where no sensing elements are provided, so as to prevent interference with an antenna element of a wireless transceiver 234.

With reference to FIG. 2C, the PCB 202 includes sensing layer 210, a dielectric layer 206, and a reference plane 220. The reference plane 220 can be exposed ("exposed reference plane regions 222") on a perimeter region 246, with the sensing layer 210 and dielectric layer 206 having a relatively reduced dimension (as represented by d) as compared to the reference plane 220. Examples recognize that exposure of the reference plane 220 at select locations (e.g., such as near the perimeter region) causes the electric field overlaying the sensing elements of the sensing layer 210 to skew directionally, to better overlay the perimeter regions 246, which can extend beyond the perimeter edge 201 of the PCB 202 to encompass a perimeter corner or edge of the exterior panel 110. In such examples, touch-input received on the exterior panel 110 on or near a corner or perimeter region 211 is detectable and interpretable by the sensing control logic 230. In contrast, under conventional approaches, the perimeter regions 246 would be blind spots on the exterior panel 110, coinciding with locations where touch-input would be undetectable.

Accordingly, with reference to FIG. 2A through FIG. 2C, in order to allow for touch responsiveness over the entire touch region 225, examples can further provide for the PCB 202 to be structured so as to selectively expose the reference plane 220, to cause the electric field used by sensing elements that are adjacent to the exposed reference plane to be influenced in shape (e.g., bend, arc) by the exposed reference plane regions 222. In particular, examples provide for exposing the reference plane 220 about or near regions of the PCB 202 where no sensing elements are provided, such as about structure void regions 242, sensor void regions 244 and perimeter regions 246. The selective exposure of the reference plane 220 causes a greater portion of the electric field that is used by the proximate and/or adjacent sensing elements to shift laterally over and beyond the exposed reference plane regions, so as to increase the overlay of the electric fields over the structure void regions 242, sensor void regions 244 and/or perimeter regions 246. In this manner, the shifting of the electric field enables touch-input that occurs over the respective structure void regions 242, sensor void regions 244 and/or perimeter regions 246 to be detectable by the respective proximate sensing elements, such that, for example, an output of the respective proximate sensing elements is distinguishable (or more distinguishable) from a baseline reference signal that is otherwise generated by the proximate sensing elements when no touch-input occurs.

Additionally, examples provide that the sensing control logic 230 can implement logic that is specific to a particular area or location of contact on the exterior panel. In some examples, the sensitivity of the sensing control logic 230 in how it interprets raw sensor data generated from the sensing layer 210 can be tuned based on the location (e.g., X/Y coordinates) of the touch contact. For example, to detect touch contact that occurs over structure void regions 242, sensor void regions 244, and/or perimeter regions 246, the sensing control logic 230 can implement a lower threshold variance as between the detected capacitance and a baseline level for sensing layer 210. Moreover, the sensing control logic 230 may determine different types of touch-input based on the location of the touch contact (e.g., X/Y coordinate). For example, the sensing control logic 230 may detect a touch-input as a stroke or movement when the touch-input overlaps with the touch groove 116. As another example, the sensing control logic 230 can detect a touch-input as a tap, or double tap, when the touch-input occurs over one of the structure void regions.

Figure 3:
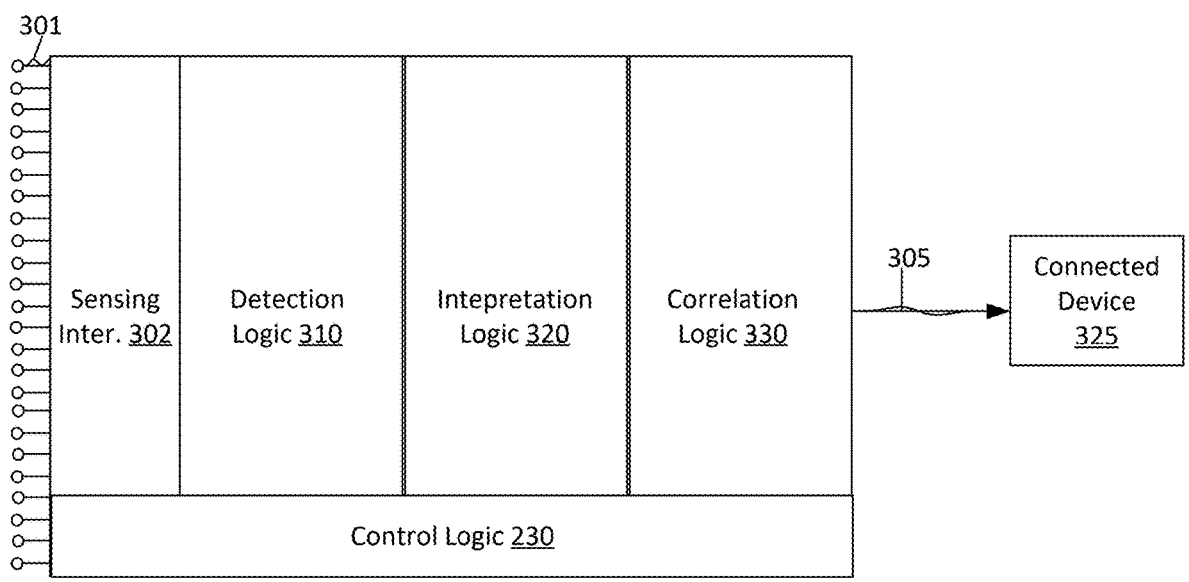
FIG. 3 illustrates an implementation of sensing control logic 230, according to one or more examples.

FIG. 3 illustrates an implementation of sensing control logic 230, according to one or more examples. In examples, sensing control logic 230 includes an interface 302 which can receive multiple sensor signals 301, with each sensor signal 301 corresponding to an output of a respective sensing element. In some examples, the sensing control logic 230 continuously receives sensor signals 301 from the sensing layer 210, where each sensor signal 301 is generated by a sensor element or discrete portion of sensing layer 210. Accordingly, each sensor signal 301 can be associated with at least one location (e.g., coordinate) of touch region 225. Each sensor signal 301 can correspond to, for example, capacitance signals generated by an electric field above a corresponding sensing element or portion of the sensing layer 210. Without any touch-input, the sensing elements of sensing layer 210 continuously generate a baseline or noise signal, and when touch-input occurs, the sensor signals 301 that are impacted by the touch-input reflect a change as compared to the baseline signal.

In examples, the sensing control logic 230 includes detection logic 310 which can continuously monitor the sensor signals 301 to detect the occurrence of a touch-input. The detection logic 310 can detect a touch-input as a change in a value of one or more sensor signals 301, where the change is in reference to the baseline or noise signal value for the sensing element. In examples, the detection logic 310 can register a touch-input when the value of one or more sensor signals 301 varies from the baseline by more than a given minimum threshold ("touch trigger threshold").

In variations, the detection logic 310 can implement additional conditions for registering changes in values of the sensor signals 301 as touch-input. By way of examples, the additional conditions can include (i) a minimum threshold number of sensing elements that generate sensor signals 301 which vary from the baseline by more than the touch trigger threshold area; and (ii) a minimum threshold time interval during which the change in the sensor signals 301 was detected.

Additionally, in detecting touch-inputs, the detection logic 310 can implement calibration or sensitivity adjustments that are specific to the location of a sensing element. The calibration or sensitivity adjustments can be made in context of determining whether a value of a sensor signal 301, individually or in combination with other signals, is indicative of touch input as opposed to noise. In examples, the detection logic 310 incorporate calibration or sensitivity adjustments for sensor signals 301 of sensing elements that are adjacent or proximate to a location of the touch region 225 which does not directly overlay any sensing element. For example, sensor signals 301 that are generated adjacent or proximate to one of the structure void regions 242, sensor void regions 244 and/or perimeter regions 246 of the circuit board can be calibrated to reflect greater sensitivity as compared to sensor signals 301 that are generated from a region of the sensor layer which directly coincided with presence of one or multiple sensing elements. The detection logic 310 can, for example, vary the touch trigger threshold for individual sensing elements based on the location of the respective sensing elements, with the touch trigger threshold being less for those sensing elements that are proximate to one of the structure void regions 242, sensor void regions 244 and/or perimeter regions 246. In this way, the detection logic 310 can be more sensitive to touch-inputs which occur on locations of the touch region 225 that do not, for example, overlay a sensing element (e.g., location beyond perimeter edge of PCB 202).

Still further, some examples recognize that a touch-input can impact the sensor signals 301 of multiple sensing elements (e.g., cluster) at one time, and over a given time interval during which the touch-input occurred, the number of sensing elements and the degree to which they are impacted may range based on attributes of the touch-input. In determining whether touch input occurs, detection logic 310 can process the sensor signals 301 for attributes which are indicative of a potential touch event, and the attributes can be analyzed to determine whether a touch input occurred, as well as the type and/or characteristics of the touch input. The attributes of the sensor signals 301 can include, for example, (i) the number of sensing elements which are impacted by a touch-input, (ii) the variation amongst the modulated sensor signals 301 that identify a touch input event, (iii) the degree and/or duration to which the sensor signals 301 are modulated, and/or (iv) the location of the sensing elements that generated the modulated sensor signals 301. The detection logic 310 can incorporate calibration or sensitivity adjustments based on the location of the sensing elements from which respective modulated sensor signal 301 are detected. In some examples, the calibration or sensitivity adjustments can include weighting one or more attributes of sensing signals 301 that are near a void or perimeter region where no other sensing element is provided. As an addition or variation, the detection logic 310 can pattern match detected attributes of sensor signals 301, such as by (i) representing attributes of a number of modulated signals as a feature vector, and (ii) comparing the determined feature vector with known feature vectors that are labeled to reflect input or no input (or alternatively, a particular type of input).

In examples, the sensing control logic 230 may also include touch interpretation logic 320, which can associate the detected attributes associated with the sensor signals 301 with an input type, characteristic and/or value. By way of example, the determined input types or values can correspond to single-tap, double-tap, long touch, slide or swipe, two-dimensional gesture, etc. In examples, the touch interpretation logic 320 can associate attributes of sensor signals 301 reflecting touch input as occurring at multiple proximate but distinct locations over a given time interval as a particular type of touch input, such as a swipe or other gesture. The touch interpretation logic 320 can further detect, based on the attributes of sensor signals 301 at multiple proximate but distinct locations, instances when a touch input reflects a touch input path that is indicative of other gestures, such as "S" shaped gestures. Still further, the touch interpretation logic 320 can associate attributes of sensor signals 301 reflecting touch input as occurring at the approximate same location but at distinct time intervals (e.g., separated by 0.5 seconds or less) as multi-tap inputs.

Still further, in some examples, the touch interpretation logic 320 can interpret one or more characteristics of the touch input based on determined attributes of the sensor signals 301. By way of example, the interpretation logic 320 can determine characteristics of the touch input that include (i) a direction of the movement, (ii) a length of movement, (iii) a linear path (or shape) of the touch input, (iv) a duration of the touch input, (v) a time interval between discrete touches of the touch input, (vi) a velocity or acceleration of movement of the touch input, and/or (vii) other characteristic of location and movement of the touch input.

In some variations, the input type, command and/or value which the interpretation logic 320 determines from a touch input can also be associated with one or more location values. For example, a touch-input in a first region (e.g., top half surrounding touch groove 116) of the touch region 225 may be interpreted differently as compared to the same touch-input in a second region (e.g., bottom half surrounding touch groove 116) of the touch region 225.

In examples, the sensing control logic 230 can include correlation logic 330 to correlate the detected attributes of the sensor signals, as well as the input type, characteristics and/or value to an output signal 305. The output signal 305 can be selected for one of multiple controlled devices 325 (e.g., light(s), ceiling fan, thermostat, appliance, security camera, television, media system or other types of devices)). Additionally, the output signal 305 can specify a setting or command based on the controlled device 325. In some variations, the output signal can be specific to the type or functionality of the controlled device 325.

Among other advantages, examples such as described with FIGS. 2A-2C and 3 enable the control device 100 to detect and interpret multiple types of touch input at any location of the exterior panel 110. In this way, the ability of the control module 120 to detect and interpret touch input is not hindered by "blind spots" which would hinder responsiveness and accuracy under conventional implementations. Moreover, the control module 120 can detect and interpret different types of touch input which utilize perimeter and edge regions of the exterior panel 110. As a result, the control device 100 can be responsive to inputs of users in context of many scenarios which are common to wall-mounted devices, such as, for example, (i) users casually approaching or walking past the control device, and (ii) users reaching to touch the control device 100, such as from a sitting position, or as a result of the user being a child.

Example Touch-Based Control Device

Figure 4:
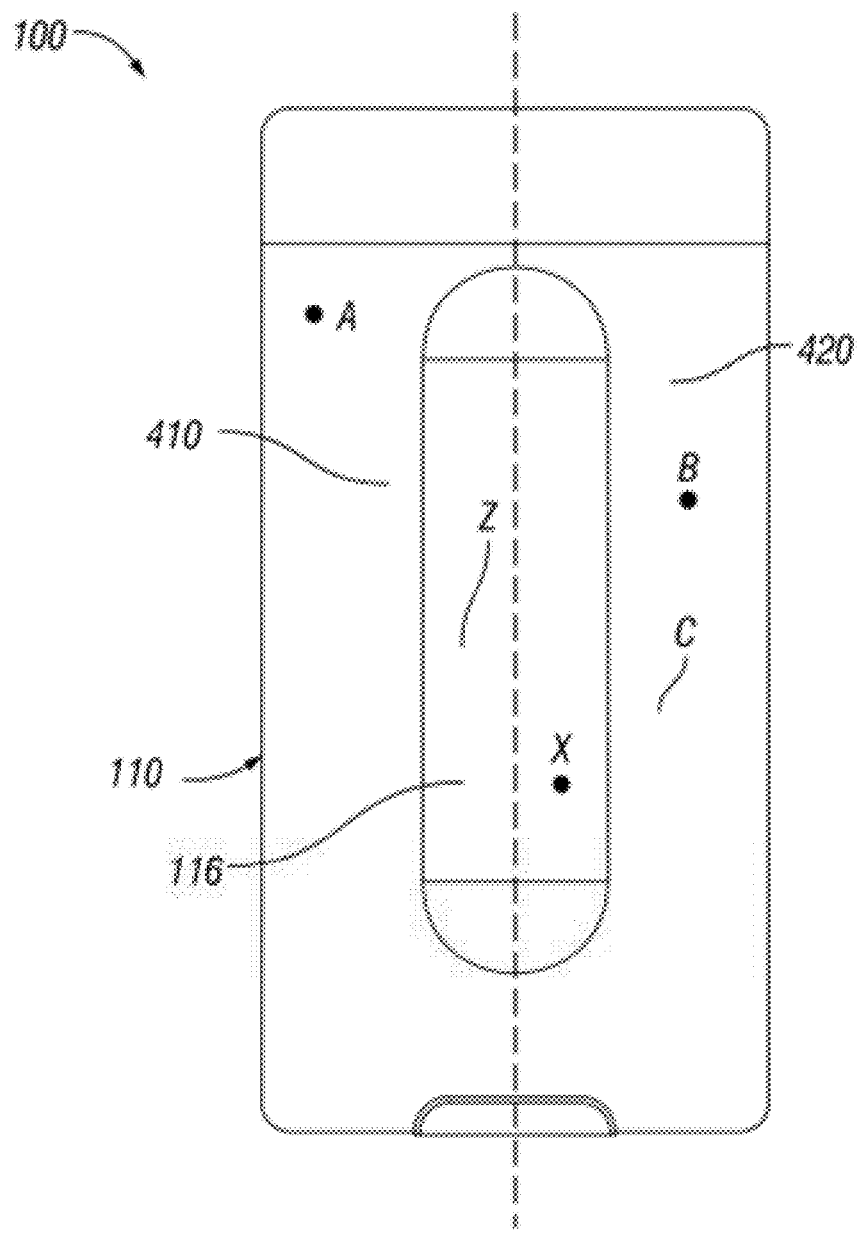
FIG. 4 illustrates examples of touch-based control device, according to various aspects described herein.

FIG. 4 illustrates examples of touch-based control device 100, according to various aspects described herein. The touch-based control device 100 can associate different regions on the exterior panel 110 with different inputs (e.g., input types or devices that may be controlled). In some examples, the control module 120 logically partitions the touch region 225 and/or exterior panel 110 into predefined regions. For example, the logical partitions of the touch region 225 can correspond to (i) a region of the touch groove 116, and (ii) a region of the exterior panel 110 which surrounds the touch groove 116. In variations, the region of the exterior panel 110 can include sub-regions (e.g., top and bottom regions, or top-left, top-right, bottom-left and bottom right regions). Likewise, the region of the touch groove 116 can also be logically partitioned—for example, the region of the touch groove 16 can include top and bottom sub-regions and/or edge and mid-regions.

With reference to an example of FIG. 4, the control module 120 logically partitions the touch input region 225 to define regions of the exterior panel 110, including left region 410, right region 420, and touch groove 116. The control module 120 can be configured to, for example, interpret touch input received on the exterior panel 110 in accordance with interpretation logic associated with each of the predefined regions of the exterior panel 110. Additionally, the control module 120 can be configured to interpret touch input based at least in part on the type of touch input, such as whether the touch input is a tap, double tap, triple tap, slide, or other continuous gesture. Further, for at least some kinds of touch input, the control module 120 can determine a value associated with the touch input, using attributes detected from the touch input.

In various examples, the operation associated with a tap can be interpreted based on a detected region of the exterior panel 110 where the tap occurred. In certain implementations, the touch-based control device 100 can be configured (based on user-input) to interpret tap A, which occurs in the left region 410 of the exterior panel 110 differently as opposed to tap B that occurs in a right region 420 of the exterior panel 110. For example, tap A in the left region 410 can be interpreted as an on/off operation for a first controlled device 125, and tap B in the right region 420 can be interpreted as an on/off operation for a second controlled device 125.

In certain examples, slide Z in the touch groove 116 can be interpreted as a power level command (e.g., dimming for lights) or other range value command, with the power level command having a value that is determined by touch input characteristics such as one or more of (i) a direction of the movement, (ii) a length of the touch input, (iii) a velocity of movement, and/or (iv) other characteristic of the touch input.

Additionally, in some variations, tap X in the touch groove 116 can also be interpreted as an on/off command. Alternatively, the tap input X can be interpreted as a power level or other range value command when inputted in the touch groove 116. In such an example, a location of tap input X within the groove (in this case a lower portion of the groove) can determine how much the controlled device 125 is to be dimmed. For tap inputs within a center region of the touch groove, the power level or other range value command can be more moderate compared to tap inputs towards the edges of the touch groove 116.

In some examples, the control module 120 can include logic to detect ambiguous touch inputs from the user. For example, the user can provide an ambiguous touch input, such as quasi-slide input C outside of the touch groove 116. In such an example, the quasi-slide input can be interpreted as either a slide input or a tap input within or near the touch groove 116. The control module 120 can employ settings, user preferences, or rules to interpret quasi-slide input C based on the location of detection and/or the linear movement of the input. For example, ambiguous input C can be interpreted by the control module 120 as either a tap input or a slide input based on a conflict resolution operation performed by the control module 120.

In certain aspects, ambiguous input C would be weighted in favor of a slide input if the touch input occurs within the touch groove 116. However, when ambiguous input C occurs on the exterior panel 110, as shown in FIG. 4, the input may be weighted more in favor of a tap input. Thus, the location of the touch input can cause the control module 120 to weight or influence the interpretation of whether the input is a tap or a slide input. In certain examples, a slide input performed by the user outside of the touch groove 116 can be ignored, interpreted as an alternative input (e.g., a tap input), or interpreted as a slide input. Likewise, a slide input that starts within or near the touch groove 116 and ends outside of the touch groove 116 can be interpreted as, for example, a tap, double tap, triple tap, slide, or other continuous gesture based on the settings, user preferences, or rules.

Methodology

Figure 5:
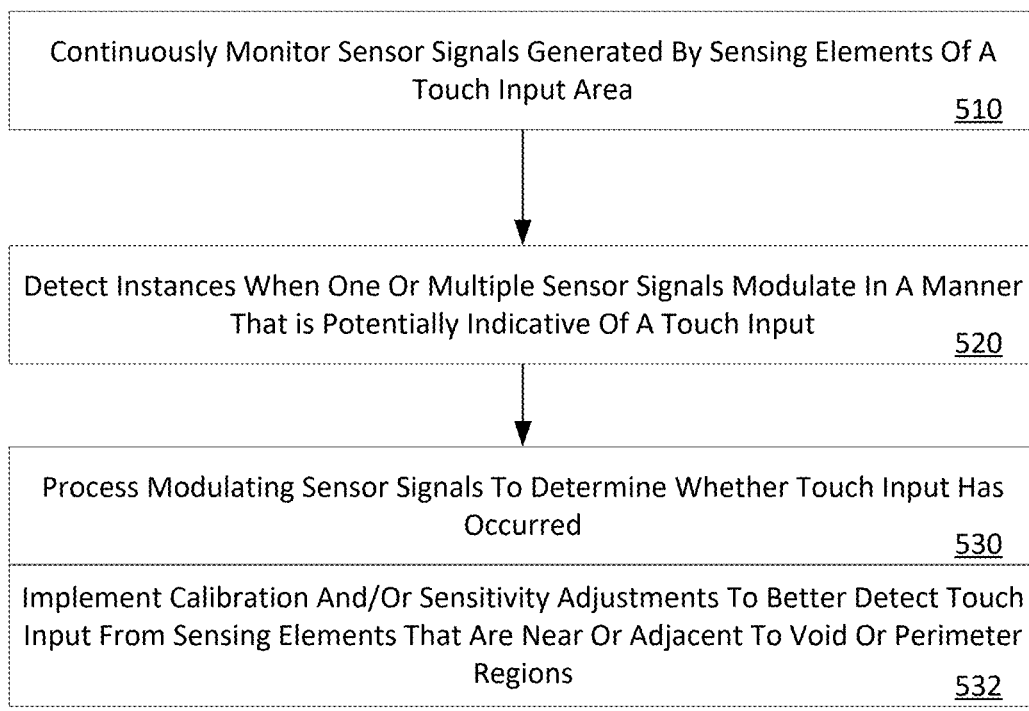
FIG. 5 illustrates an example method of operating a touch-based control device, according to one or more examples.
Figure 6A:
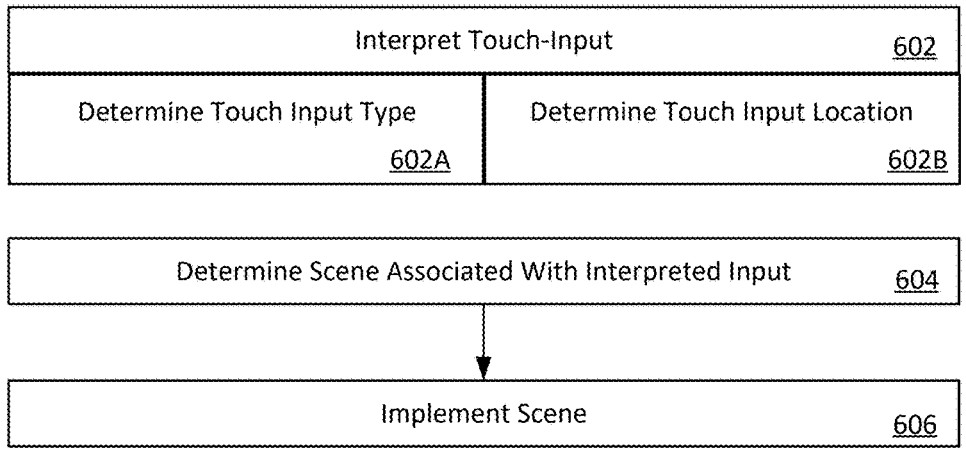
FIGS. 6A and 6B illustrate example methods of configuring and generating scenes based on touch inputs performed on a touch-based control device, according to one or more examples.
Figure 6B:
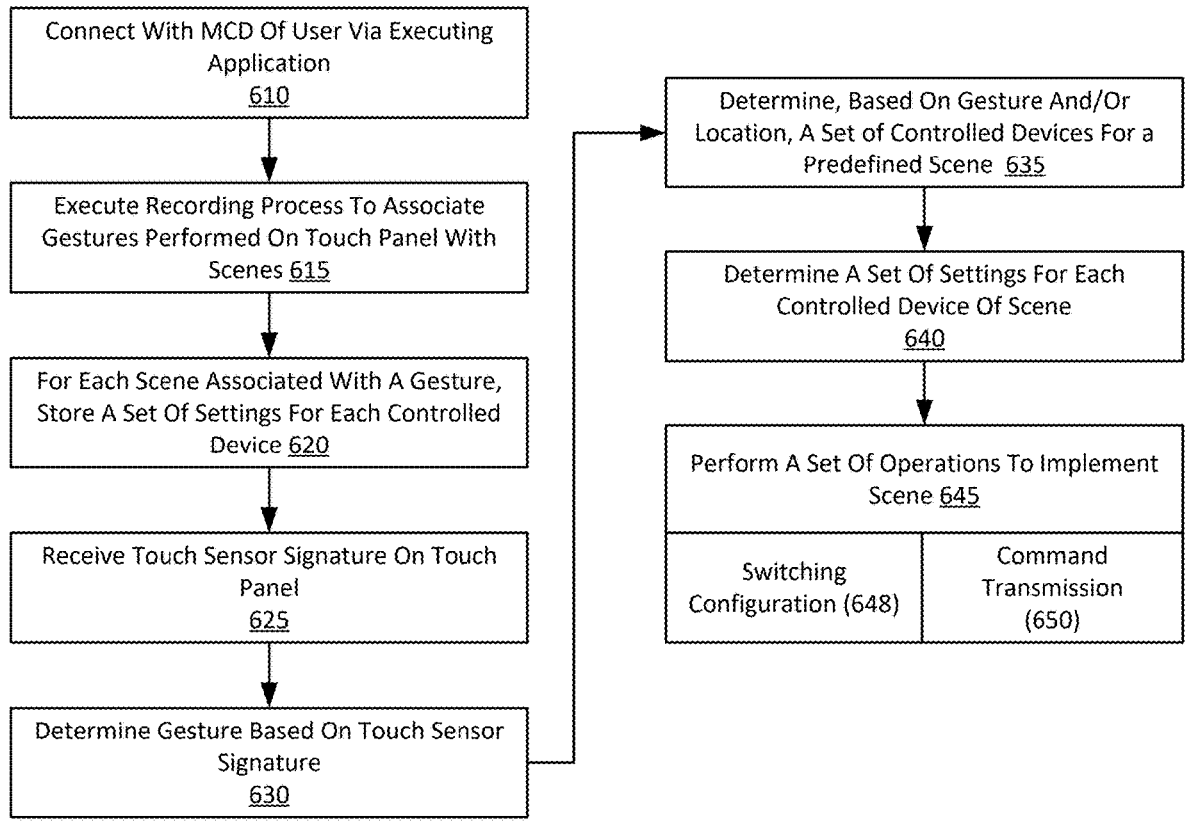

FIG. 5 illustrates a method of operating a touch-based control device, according to one or more examples. FIGS. 6A and 6B illustrate methods of configuring and generating scenes based on gesture interactions performed on a control device 100, according to one or more examples. In describing the examples of FIGS. 5, 6A and 6B, reference may be made to various elements as shown and described with respect to FIG. 1A, FIG. 1B and elsewhere in this application, for purpose of illustrating steps or sub-steps being described.

According to examples, the control module 120 continuously monitors sensor signals 301 generated by sensing elements of the sensing layer 210 (510). The control module 120 can further detect instances when one or multiple sensor signals 301 modulate in a manner that is potentially indicative of a touch-input (520). For example, the control module 120 can detect when the modulating sensor signal(s) 301 exceed a corresponding baseline value by an amount which exceeds the touch trigger threshold.

The control module 120 can process the modulating sensor signals 301 to determine whether a touch input has occurred (530). Further, in making the determination, the control module 120 can implement calibration and/or sensitivity adjustments that are based on the location of the sensor signals 301 (532). In particular, the control module 120 can implement the calibration and/or sensitivity adjustments so that modulated sensor signals 301, resulting from one or multiple sensing elements that are adjacent to a void or perimeter region, can properly be detected and interpreted as touch input.

As an addition or alternative, the control module 120 can analyze modulating sensor signal(s) 301 to identify attributes that include (i) a number of modulating sensing elements, (ii) the variation amongst the modulated sensor signals 301, (iii) the degree and/or duration to which the sensor signals 301 are modulated, and (iv) the location of the modulated sensor signals 301. Additionally, the control module 120 can weight attributes determined from sensing elements that are proximate or adjacent void or perimeter regions to reflect more sensitivity, so as to better detect touch-input that occurs over a void or perimeter region.

With reference to FIG. 6A, the touch-based control device 100 detects and interprets touch input (602). In examples, the touch input can be interpreted based on type of touch input (602A) and/or location of the touch input (602B). The type of touch input can be determined from one or more determined characteristics of the touch input. For example, the characteristics of the touch input can include (i) a direction of the movement, (ii) a length of movement, (iii) a linear or two-dimensional path (or shape) of the touch input, (iv) a duration of the touch input, (v) a time interval between discrete touches of the touch input, (vi) a velocity or acceleration of movement of the touch input, and/or (vii) other characteristics determined of the touch input. The control device 100 can interpret the touch input based on the presence/non-presence or value of one or more characteristics.

The location of the touch input can correspond to a predefined region where the touch input occurred. For example, the control module 120 can logically partition the touch region 225 into sub-regions, such as (i) left and right regions, (ii) quadrants, and/or (iii) within touch input groove and outside of touch groove 116. The control device 100 can interpret the touch input based on location through implementation of rules or other logic. For example, the partitions of the exterior panel 110 can be defined by user input (e.g., user operates mobile device to select or define partitions of touch region 225). For example, certain input types may be interpreted in a particular manner when the respective input is detected in a particular region. For example, vertical swipes may be detected as a range value setting (e.g., power level) when the respective input is within a touch input groove. Additionally, inputs within a groove may be interpreted as vertical swipes, or alternatively, weighted as vertical swipes, such that the predominant input that is interpreted with respect to touch groove 116 are swipes. To further the example, inputs outside of the touch groove 116 may be interpreted, or weighted to interpret, as tap inputs, such as single, double or triple taps. Thus, in some examples, inputs with similar characteristics may be interpreted differently, depending on where the touch inputs are detected.

As another example, some types of inputs can correspond to two-dimensional gestures (e.g., "S" shape). The control module 120 can detect, for example, such touch inputs as being the same regardless of the location of the touch input. Alternatively, the input can be interpreted differently based on the region of the exterior panel 110 where the touch input is detected. Numerous such variations are possible, based on configurations of the control device 100 and/or user preferences and/or settings.

The control device 100 determines a scene associated with the interpreted input (604), where the scene identifies one or more devices that are to be controlled to have a particular output (e.g., a setting) in accordance with a scene. The control device 100 uses one or more interfaces (e.g., electrical interface 122, or one or more wireless transceivers) to implement operations on the controlled devices 125 in accordance with the specifications (e.g., identified devices and settings) of the scene (606).

With reference to an example of FIG. 6B, the control device 100 can connect with a mobile computing device of a user via an executing application (610). In various examples, the control device 100 can execute a recording process to associate gestures performed on the exterior panel 110 and/or touch groove 116 with corresponding scenes (615). In further examples, the control device 100 can store a set of settings for each relevant controlled device 125 (e.g., smart home device) of each predefined scene. (620). Any variety of input types (e.g., gestures or touch combinations) can be recorded and/or preconfigured for association with a scene. Still further, multiple scenes may be predefined, with each scene being associated with a corresponding input type.

In various implementations, the gesture control device 100 may then receive a touch input corresponding to a particular gesture performed on the exterior panel 110 and/or touch groove by a user (625). The control device 100 may then determine a gesture based on the characteristics of the touch input (630). Based on the gesture and/or location of the gesture the control device 100 can determine, a set of controlled devices 125 for implementing a corresponding scene (635). The control device 100 may further determine a set of settings for each controlled device of the scene (640). The control device 100 may perform a set of operations (e.g., transmit a set of control commands, implement a switching configuration) for each controlled device 125 to implement, in accordance with the scene (645). As described with other examples, the settings of controlled devices 125 can be implemented through operations to implement a switching configuration with respect to a power supply line of one or more of the controlled devices 125 (648), and/or transmission of control commands to controlled devices using a wireline or wireless medium (650).

Scene Implementation

Figure 7B:
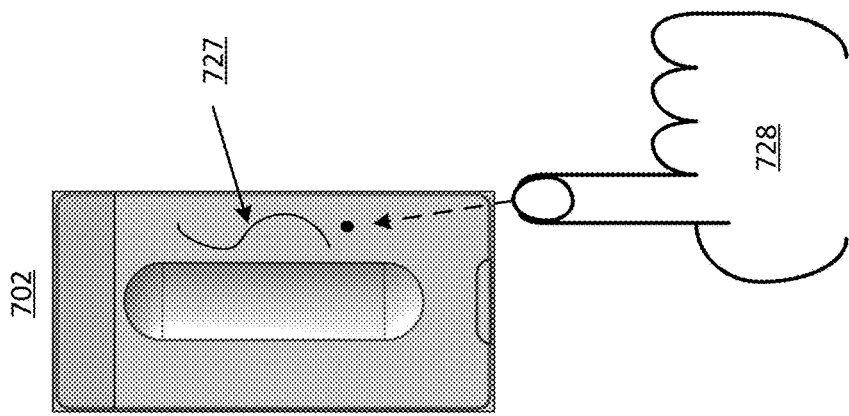
FIG. 7B illustrates a gesture performed by a user on an example touch-based control device, according to one or more examples.
Figure 7A:
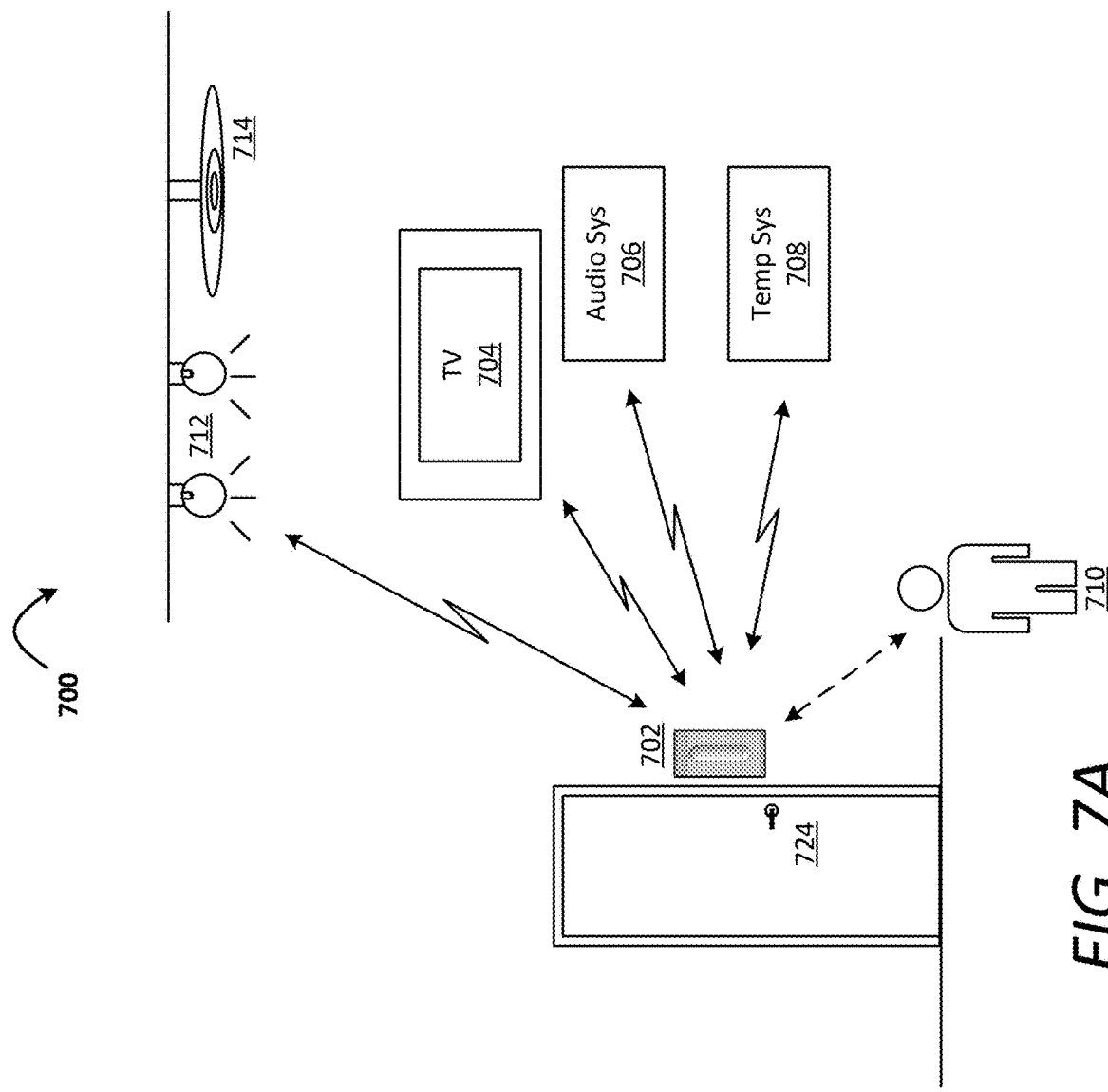
FIG. 7A illustrates implementation of a scene by an example touch-based control device, according to various aspects described herein.

FIG. 7A illustrates implementation of a scene by an example touch-based control device, according to various aspects described herein. A touch-based control device 702 can be implemented as an embodiment of control device 100 and other examples described herein. As described herein, the control device 702 can be mounted to a wall of a home environment 700 to control devices in a dwelling. For example, the control device 702 can use a local network to control connected devices (e.g., smart home devices), such as lighting elements 712, a fan 714, a television 704, an audio system 706, a temperature control system 708, a door locking system 724, automatic window shades, smart home appliances, and any number of other smart home devices mentioned throughout the present disclosure. As an addition or alternative, the control device 702 can control load devices (e.g., lights 312, ceiling fan 314) through control of power supply lines.

In the example shown, a user 710 can enter a particular room and perform a gesture or other touch input on the control device 702. The input can be detected and interpreted by the control device 702 and communicated to relevant controlled devices to execute a corresponding scene. When the control device 702 receives the gesture, it can execute a scene corresponding to the gesture by generating and transmitting control commands to the various smart home devices needed to execute the automatic scene. As an addition or alternative, the control device 702 can perform switching operations with one or more power supply lines for load devices, in order to cause the load devices to implement a setting or other operational aspect. For example, the scene can comprise a combination of dim levels for lighting elements 712, displayed content on the television 704, a music channel or file content to be played on the audio device 706, a certain temperature setting on the temperature control system 708, activation of the fan 714 at a certain setting, and/or the door locking mechanism 724 to be activated or deactivated. Based on the various settings of the scene, the control device 702 can implement control operations to immediately implement the scene associated with a particular gesture input. It is contemplated that any number of scenes creatable by the smart home devices can be configured by the user using the control device 702, as described in further detail below.

FIG. 7B illustrates a gesture performed by a user on control device 702. In the example of FIG. 7B, the user 728 can perform a gesture 727 on the control device 702 to implement a scene using any number of settings for any number of load or connected devices (e.g., smart home devices), such as those shown in FIG. 7A. As an example, the user 728 can perform an "S" gesture with a following tap below the gesture. The user 728 may have previously recorded this unique gesture to be associated with an evening scene a home environment 700 (e.g., for when the user 728 gets home from work).

As such, the user 728 can enter the smart home environment 700 and perform the unique gesture 727 on the control device 702 to trigger implementation of the evening scene. By way of example, implementation of the evening scene can automatically turn the lights 712 on/off and/or to a specific dim level, turn the television 704 on to a specific channel with a specific volume level, turn on the audio system 706 (e.g., which can play audio from the television content), tune the audio system 706 to a specific volume, and set the temperature control system 708 to a specified temperature (e.g., seventy-two degrees Fahrenheit).

Scene Configuration

Figure 8A:
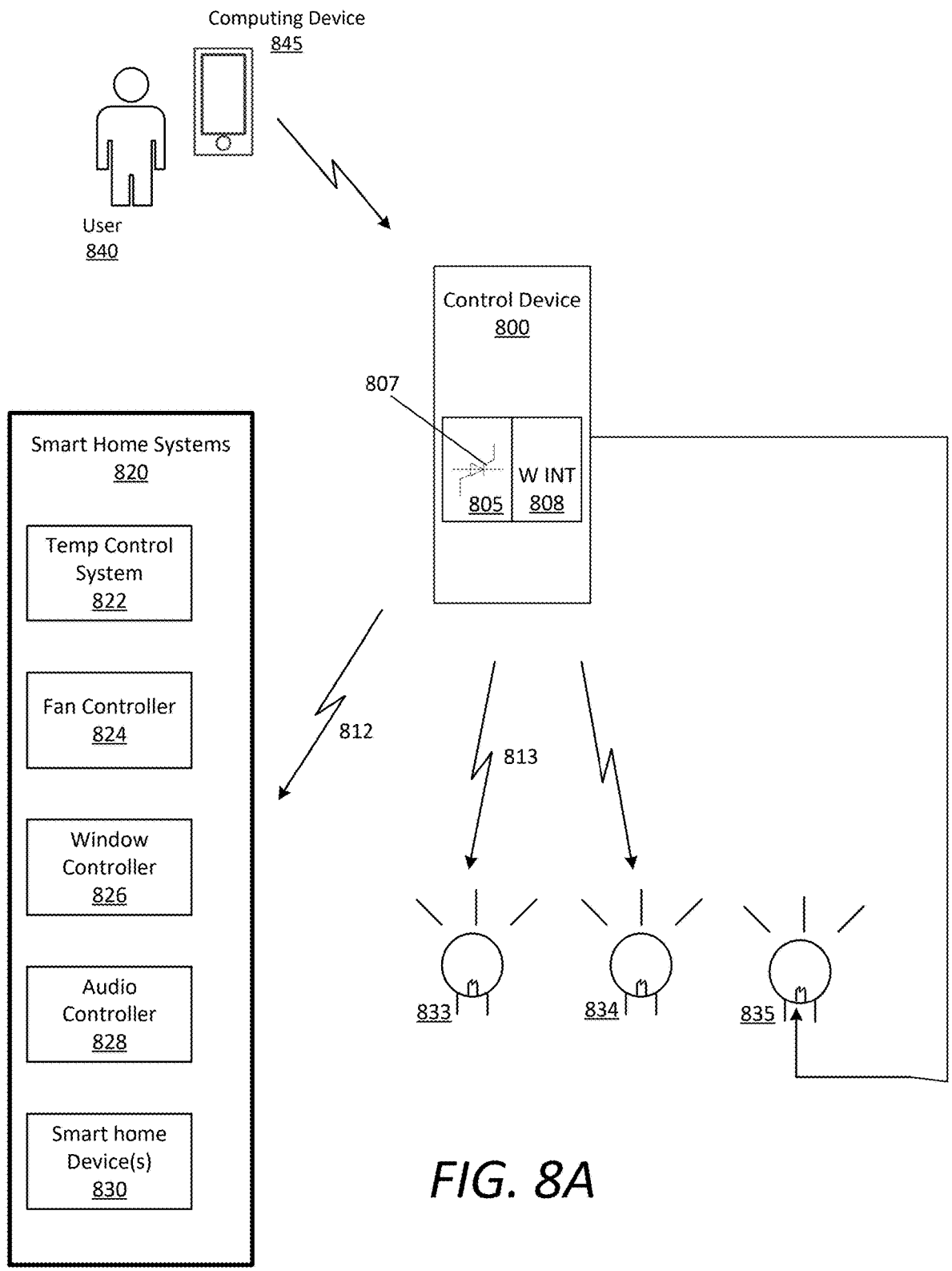
FIG. 8A illustrates another example of a touch-based control device, according to various embodiments.

FIG. 8A illustrates another example of a touch-based control device, according to various embodiments. A touch-based control device 800 can be implemented as an embodiment of control device 100 and other examples described herein. In an example shown by FIG. 8, the control device 800 can be mounted to replace an existing light switch panel. The control device 800 can include and can further utilize existing load and line wires of an electrical box mounted within the wall behind the light switch panel.

The control device 800 can include processing and memory resources, as well as network communication modules implementing one or more network communications protocols. In certain aspects, the control device 800 includes electrical interface 805 having switching elements 807 to perform switching operations for controlling operational aspects of load devices (e.g., light device 835) using power supply line 815. In this way, lighting devices, ceiling fans and other load devices can be connected and controlled by the control device 800 using power supply line 815.

As an addition or variation, the control device 800 can include one or more wireless transceivers 808 to communicate commands to connected devices, such as devices of smart home system 820. As an addition or alternative, the control device 800 can utilize wireless transceivers to transmit commands to connected devices.

By way of example, the control device 800 can include lighting control capabilities. The control device 800 can, for example, use electrical interface 805 to function as an AC dimmer, using switching elements 807 and/or other signal manipulation elements to control the power input provided to the light device 835 and other load devices. The switching elements 807 can manipulate a waveform of the power input for the light device 835, resulting in a duty cycle that indicates the desired amount of dimming. Further, the electrical interface 805 can perform switching operations using field-effect transistor (FET), such as a MOSFET (e.g., a pair of FETs and/or MOSFETs), under the control of a microcontroller that adjusts the switching operations to meet a specific output for the load device. As an addition or variation, control device 800 can transmit control commands to lighting device 835 and other load devices, using a wireless network such as WiFi, Zigbee, Z-Wave, or Bluetooth (including BLE), where the control commands reflect a specified on/off/dimming state and/or other operational aspects of the lighting device 835 (e.g., hue output, blink state, etc.). In such examples, the commands can be based on touch input, such as the type of touch input and/or location of the touch input.

The control device 800 can store multiple settings for connected devices, as well as scenes which define settings for multiple connected devices. When the control device 800 detects a gesture or other input, the control device 800 can perform a set of operations to cause one or more controlled devices to implement settings associated with a scene that correlates or otherwise maps to the input. For example, the control device 800 can implement switching operations, using electrical interface 805 and switching elements 807, to control the input power of one or more load devices (e.g., lighting device 835). Additionally, the control device 800 can implement command operations to transmit control commands to smart home devices, such as devices that comprise a smart home system 820. In this way, the control device 800 can select a scene based on a touch input of a user, and perform operations for controlling operational aspects of any of the lights 833, 834, 835 or smart home systems 820 connected to the touch-based control device 800.

In various examples, the control device 800 implements control operations to set a range value for a respective controlled device. For example, a range value command can specify a numerical value that reflects a power (or brightness) level of a connected lighting device 835. The range value can specify a numerical value that can range between a maximum and minimum value. Thus, for example, the control device 800 can assign numerical values to the dimming level of lights in a predetermined range 0 . . . n, where 0 represents "off" and n represents a maximum value. For load devices, examples provide that the control device 800 can implement the range value using switching operations. For connected devices, the control device 800 can implement the range value using command operations, where, for example, control commands specify such numerical values. As an addition or variation, the control device 800 can implement control operations to control an operational aspect such as a binary state of a lighting device (e.g., on/off). Still further, the control device 800 can implement control operations to control other operational aspects of lighting devices, such as hue (e.g., colored LED lights) or blink state. Still further, for some load devices, the control device 800 can further implement switching operations (using electrical interface 805 and switching elements 807) and transmit control commands to implement different operational aspects or settings (e.g., dimming state and hue).

The control device 800 can enable the user 840 to operate any number of connected smart home systems 820, such as smart light devices 833, 834, a temperature control system 822, a fan controller 824, a window controller 826, an audio controller 828, or any other smart home device 830 (e.g., a smart kitchen appliance, sprinkler system, security system, television, etc.). In certain implementations, the user 840 can select one or more smart home devices on a user interface of a computing device 889 executing a designated application, establish a set of settings for each smart home device, and record a gesture or other input to identify a scene. The user can subsequently perform the touch input on the exterior of the control device 800 to cause the control device 800 to implement the identified scene.

User Computing Device and Scene Configuration

Figure 8B:
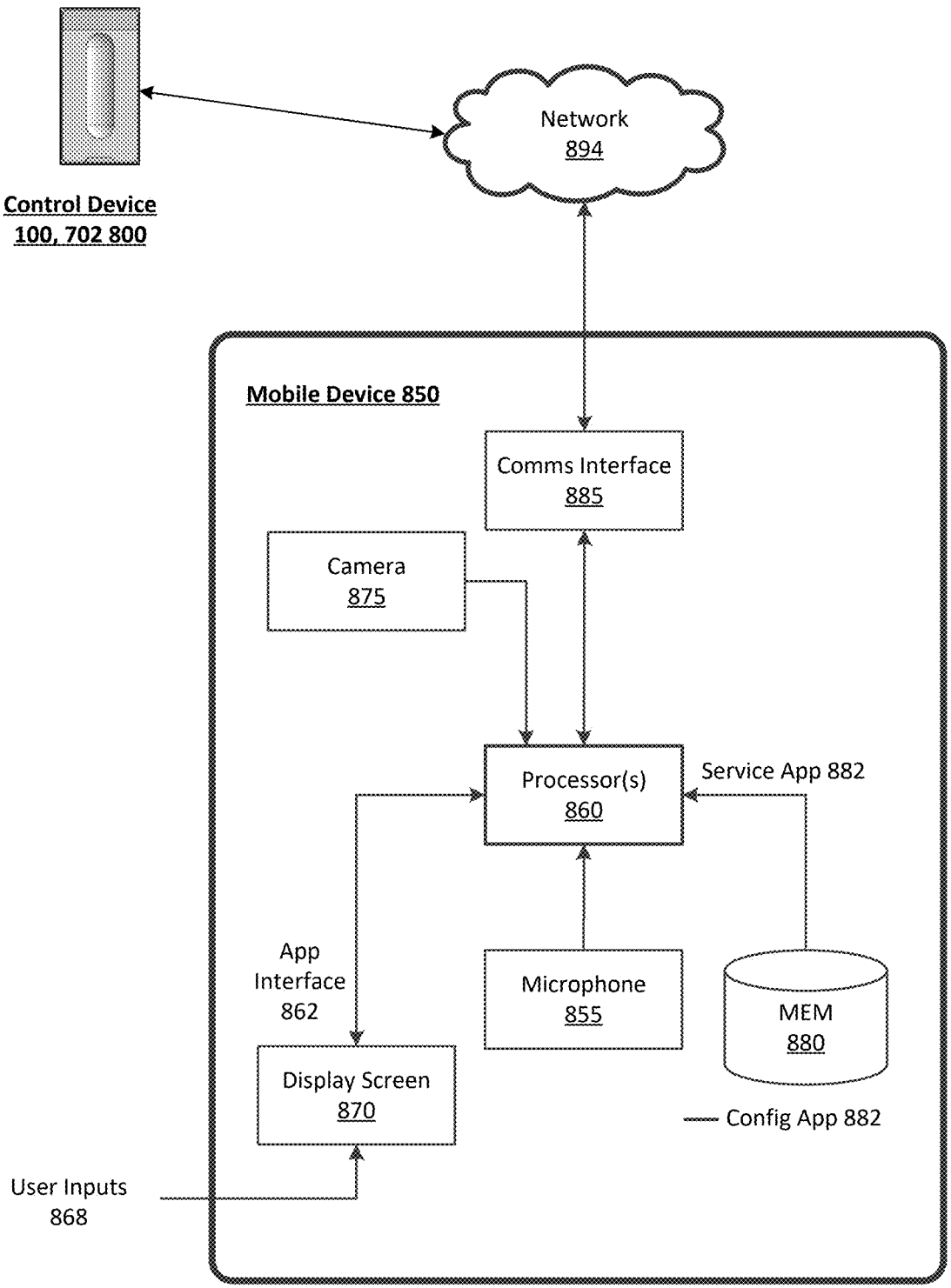
FIG. 8B is a block diagram illustrating an example of a mobile computing device for enabling a user to define one or more aspects of a control device such as described with various embodiments.

FIG. 8B is a block diagram illustrating an example of a mobile computing device 890 for enabling a user to define one or more aspects of a control device 100, 702, 800 such as described with various embodiments. The mobile device 890 can include a designated configuration application 882 that enables the mobile device 890 to communicate with, for example, control device 100, 702, 800. Among other functions, the mobile device 890 can operate to configure one or more control devices 100, 702, 800 of a dwelling. In particular, the mobile device 890 can execute the configuration application to define and configure scenes and other responsive behavior of the mobile device 890. By way of example, the mobile device 890 can select load and connected devices for scenes, enable users to specify settings or other operational aspects of selected devices, and further to update stored scenes with additional devices and/or settings.

In many implementations, the mobile device 890 can comprise a mobile computing device, such as a smartphone, tablet computer, laptop computer, VR or AR headset device, and the like. As such, the computing device 890 can include typical telephony features such as a display screen 870, microphone 855, camera 875, and communication interface(s) 885 to communicate with external devices using any number of wireless communication protocols and over one or multiple networks 894. In certain aspects, the mobile device 890 can store a designated application (e.g., a configuration app 882) in a local memory 880.

In response to a user input 868, the configuration app 882 can be executed by a processor 860, which can cause an app interface 862 to be generated on the display screen 870 of the computing device 890. The app interface 862 can enable the user to, for example, connect the computing device 890 with the control device 100, 702, 800 (or an intermediary wireless hub) over a network 894, and view the various smart home and load devices that can be controlled by the control device 100, 702, 800.

The user can utilize the app interface 862 to configure a scene comprised of various settings or selected load and/or smart home devices. In one example, the user can manually set a scene in the smart home environment, and then connect with the control device 100, 702, 800 to record a corresponding gesture for the scene. In variations, the user can select various settings of the load and smart home devices via the app interface 862 (e.g., channel selections, dim levels, audio settings, temperature settings), and then attribute the scene corresponding to these settings to a unique gesture performed on the gesture control device 899.

For example, when the user has configured a particular scene, the app interface 862 can include a record selection feature, which can enable the user to perform the desired gesture on the façade of the control device 100, 702, 800. In certain aspects, the app interface 862 can instruct the user to perform the same gesture multiple times to record the scene, in order to establish error buffers for future gestures. In still further examples, the app interface 862 can provide a trace of a particular gesture and can further provide information corresponding to the associated scene (e.g., a unique name for the scene, such as "evening scene," "bedtime scene," and the like). As described herein, the user can configure any number of scenes using any number of gestures.

Hardware Diagram

Figure 9:
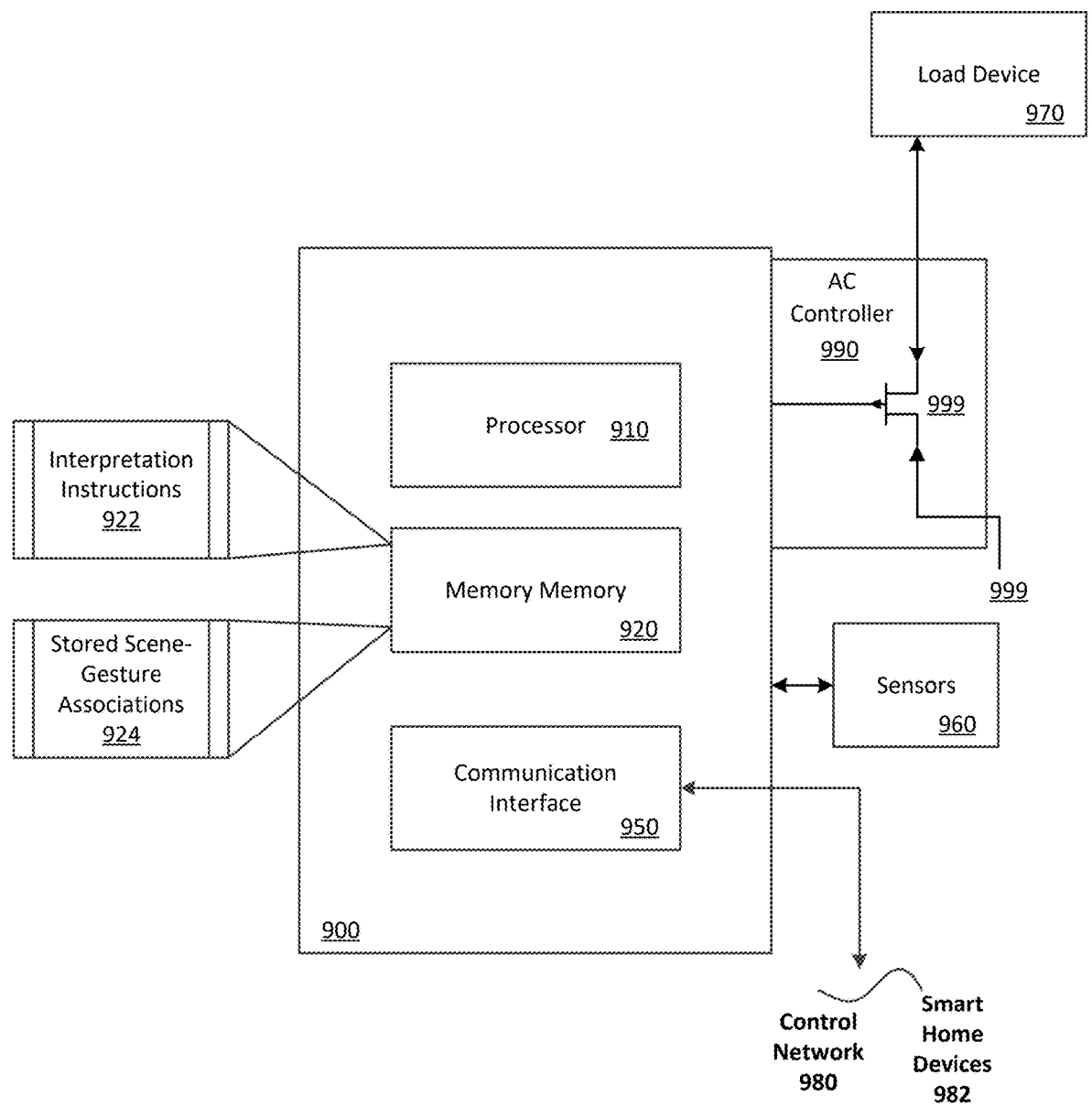
FIG. 9 is a simplified hardware diagram of a touch-based control device, according to one or more examples.

FIG. 9 is a simplified hardware diagram of a touch-based control device, according to one or more examples. A control device 900 can be implemented as an embodiment of other control devices 100, 702, 800, as described with various examples in this disclosure.

In one implementation, the control device 900 includes processing resources 910, memory 920, and one or more communication interface(s) 950. The control device 900 includes at least one processor 910 for processing information stored in memory 920, such as provided by a random-access memory (RAM) or other dynamic storage device, for storing information and instructions which are executable by the processor 910.

As provided herein, control module 120 of the control device 100 can comprise the processor 910 or combination of the processor 910 and memory 920 as shown and described with respect to FIG. 9. In various embodiments, the control module 120 may be a general-purpose microprocessor, a microcontroller, a combination of one or more microprocessors and/or microcontrollers acting in concert, and/or a touch sensor specific integrated circuit incorporating, or connected to, one or more of these processing configurations. The memory 920 may be used for storing temporary variables or other intermediate information during execution of instructions to be executed by the processor 910. The memory 920 may also include ROM or other static storage device for storing static information and instructions for the processor 910.

The communication interface(s) 950 can enable the control device 900 to communicate over one or more control networks 980 (e.g., Bluetooth, Zigbee, Wi-Fi, etc.) through use of one or more wireless network links. Using the network links, the control device 900 can communicate with one or more smart home devices, one or more servers, or third-party intermediary communication module. The executable instructions in the memory 920 can include, for example, touch input detection and interpretation instructions 922, which the control device 900 can execute to detect and interpret touch input performed by users on the surface (e.g., exterior panel) of the control device 900. The control device 900 can implement control operations in response to detecting and interpreting touch input. For example, the processor 910 can execute the instructions 922 to interpret sensor signals generated by a layer of touch sensors 960 which are provided underneath the exterior panel 110. In response to detecting and interpreting touch input, the control device 900 generates control commands and performs other control operations to implement an associated scene.

The executable instructions stored in memory 920 can also include stored scene-gesture associations 924, which the control device 900 can reference upon receiving corresponding sensor signals of touch sensors 960. As described herein, the control device 900 can be connected via a wired connection to one or more home devices (e.g., light elements), or can implement wireless network protocols to connect with smart home devices via the control network 980 to transmit the control commands.

In some embodiments, the control device 900 can be coupled to AC controller 990, for example by clips that provide for an electrical connection to be made between spring clips or pogo pins on one side (e.g., the control device 900 or the AC controller 990) and electrically conductive pads on the corresponding side. AC controller 990 may include connections to wall wiring for line, load, neutral, and/or ground wires, and in some embodiments, may include L1 and L2 outputs for 3-way configurations. In some embodiments, AC controller 990 may include an AC microcontroller which receives instructions from the processor 910, and which may control field effect transistors, triac(s), and/or other switching elements for purpose of controlling a power supply line of a load device. In certain examples, the AC controller 990 can include a dimming FET 999 connecting the AC controller 990 to a line wire and load wire of existing wiring (e.g., of a light switch). In the example shown in FIG. 9, the load wire connects the AC controller 990 to the one or more load devices 970 (e.g., lights), and the line wire connects the AC controller 990 to a power supply line 997.

The processor 910 can be configured with software and/or other logic to perform one or more processes, steps and other functions described with implementations, such as described with various examples of this disclosure. Examples described herein are related to the use of the control device for implementing techniques described herein with respect to methods such as described with FIGS. 5, 6A, 6B and elsewhere in this disclosure. According to one example, those techniques are performed by the control device 900 in response to the processor 910 executing one or more sequences of one or more instructions contained in the memory 920. Such instructions may be read into the memory 920 from another machine-readable medium. Execution of the sequences of instructions contained in the memory 920 causes the processor 910 to perform steps and operations as described herein. In alternative implementations, hard-wired circuitry may be used in place of or in combination with software instructions to implement examples described herein. Thus, the examples described are not limited to any specific combination of hardware circuitry and software.

It is contemplated for examples described herein to extend to individual elements and concepts described herein, independently of other concepts, ideas or systems, as well as for examples to include combinations of elements recited anywhere in this application. Although examples are described in detail herein with reference to the accompanying drawings, it is to be understood that the concepts are not limited to those precise examples. As such, many modifications and variations will be apparent to practitioners skilled in this art. Accordingly, it is intended that the scope of the concepts be defined by the following claims and their equivalents. Furthermore, it is contemplated that a particular feature described either individually or as part of an example can be combined with other individually described features, or parts of other examples, even if the other features and examples make no mention of the particular feature. Thus, the absence of describing combinations should not preclude claiming rights to such combinations.

What is claimed is:

1. A control device comprising:
   a control module including a sensor layer having a plurality of sensing elements, the control module being operable to control a plurality of devices;
   an exterior panel arranged in communication with the sensor layer; and
   wherein the control module is configured to:
      execute detection logic that implements calibration and/or sensitivity adjustment upon detecting a touch gesture performed on the exterior panel;
      control an operational aspect of each device of the plurality of devices in accordance with a determination as to whether the touch gesture is performed on a first region of the exterior panel or on a surrounding region to the first region.

2. The control device of claim 1, wherein the exterior panel is display-less.

3. The control device of claim 1, wherein the first region includes a touch groove, and wherein the control module is configured to detect touch inputs provided on the touch groove and the surrounding region of the exterior panel.

4. The control device of claim 1, wherein the control module is configured to detect touch inputs provided at any location over at least a portion of the exterior panel.

5. The control device of claim 1, wherein the control device is wall-mountable with the exterior panel forming a faceplate when the control device is mounted thereon.

6. The control device of claim 1, wherein the control module is configured to partition the surrounding region of the exterior panel into multiple sub-regions, and wherein the control module is further configured to interpret the touch gesture based at least in part on a determination of a sub-region of the multiple sub-regions upon which the touch gesture is detected.

7. The control device of claim 6, wherein the control module determines one or more characteristics of the touch gesture based on one or more attributes of sensor signals of the sensor layer.

8. The control device of claim 7, wherein the determined one or more characteristics of the touch gesture include (i) a direction of movement, (ii) a length of the movement, (iii) a linear path or shape of the touch gesture, (iv) a duration of the touch gesture, (v) a time interval between discrete touches of the touch gesture, or (vi) a velocity or acceleration of movement of the touch gesture.

9. The control device of claim 1, wherein the control module controls the operational aspect of at least one device of the plurality of devices by implementing switching operations on a power supply line for the at least one device to cause the at least one device to implement a corresponding operational setting in accordance with a selected scene of a plurality of scenes, each scene in the plurality of scenes being associated with respective operational settings for the plurality of devices.

10. The control device of claim 9, wherein the control module controls the operational aspect by transmitting a command operation to the at least one device, the command operation causing the at least one device to implement a corresponding operational setting in accordance with the selected scene.

11. The control device of claim 10, further comprising:
   a wireless transceiver;

wherein the control module transmits the command operation wirelessly to the at least one device using the wireless transceiver.

12. The control device of claim 10, further comprising:
a wireless transceiver;
wherein the control module transmits the command operation wirelessly to an intermediary device using the wireless transceiver, and wherein the intermediary device transmits the command operation to the at least one device to cause the at least one device to implement a corresponding operational setting.

13. A base assembly for a wall-mountable control device, the base assembly comprising:
a control module including a sensor layer having a plurality of sensing elements, the control module being operable to control a plurality of devices;
wherein the sensor layer is positioned within a threshold proximity to an exterior panel assembled onto the base assembly, and wherein the exterior panel comprises a first region and a surrounding region to the first region;
wherein the control module is configured to:
execute detection logic to detect a touch gesture performed on the exterior panel, the detection logic implementing calibration and/or sensitivity adjustments that are specific to locations of sensing elements upon which the touch gesture is performed; and
control an operational aspect of each device of the plurality of devices in accordance with a determination as to whether the touch gesture is performed on the touch groove or on the surrounding region.

14. The base assembly of claim 13, wherein the control module is configured to detect touch inputs provided on any location of the first region and the surrounding region.

15. The base assembly of claim 13, wherein the control module is configured to partition the surrounding region of the exterior panel into multiple sub-regions, and wherein the control module is further configured to interpret the touch gesture based at least in part on a determination of a sub-region of the multiple sub-regions upon which the touch gesture is detected.

16. The base assembly of claim 15, wherein the control module determines one or more characteristics of the touch gesture based on one or more attributes of sensor signals of the sensor layer.

17. The base assembly of claim 16, wherein the determined one or more characteristics of the touch gesture include (i) a direction of movement, (ii) a length of the movement, (iii) a linear path or shape of the touch gesture, (iv) a duration of the touch gesture, (v) a time interval between discrete touches of the touch gesture, or (vi) a velocity or acceleration of movement of the touch gesture.

18. The base assembly of claim 13, wherein the control module controls the operational aspect of at least one device of the plurality of devices by implementing switching operations on a power supply line for the at least one device to cause the at least one device to implement a corresponding operational setting in accordance with a selected scene of a plurality of scenes, each scene in the plurality of scenes being associated with respective operational settings for the plurality of devices.

19. The base assembly of claim 18, wherein the control module controls the operational aspect of at least one device of the plurality of devices by transmitting a command operation to the at least one device, the command operation causing the at least one device to implement a corresponding operational setting in accordance with the selected scene.

20. The base assembly of claim 19, further comprising:
a wireless transceiver;
wherein the control module transmits the command operation wirelessly to an intermediary device using the wireless transceiver, and wherein the intermediary device transmits the command operation to the at least one device to cause the at least one device to implement a corresponding operational setting.

* * * * *